United States Patent
Asai et al.

(10) Patent No.: US 11,489,556 B2
(45) Date of Patent: Nov. 1, 2022

(54) COMMUNICATION APPARATUS, WIRELESS COMMUNICATION SYSTEM, AND COMMUNICATION METHOD

(71) Applicant: CANON KABUSHIKI KAISHA, Tokyo (JP)

(72) Inventors: Hitoshi Asai, Tokyo (JP); Yuki Shoji, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 8 days.

(21) Appl. No.: 16/993,078

(22) Filed: Aug. 13, 2020

(65) Prior Publication Data
US 2021/0067204 A1   Mar. 4, 2021

(30) Foreign Application Priority Data

Aug. 30, 2019  (JP) .............................. JP2019-158663
Jun. 22, 2020  (JP) .............................. JP2020-107127

(51) Int. Cl.
H04B 5/00       (2006.01)
H01Q 7/00       (2006.01)
H03F 3/45       (2006.01)

(52) U.S. Cl.
CPC ............. H04B 5/0081 (2013.01); H01Q 7/00 (2013.01); H03F 3/45071 (2013.01)

(58) Field of Classification Search
CPC .. H04B 5/0081; H04B 5/0031; H04B 5/0075; H04B 5/0012; H01Q 7/00; H03F 3/45071
USPC ...................................................... 455/41.1
See application file for complete search history.

(56) References Cited

U.S. PATENT DOCUMENTS

| | | | |
|---|---|---|---|
| 4,646,319 A * | 2/1987 | Engel ....................... | H04B 3/56 340/12.37 |
| 6,271,678 B1* | 8/2001 | Sochoux ............... | H05K 1/0233 326/30 |
| 2004/0139261 A1* | 7/2004 | Dreps ..................... | H04L 25/06 710/305 |
| 2014/0073243 A1 | 3/2014 | Hijioka | |
| 2016/0020826 A1* | 1/2016 | Fujii ...................... | H04B 3/544 375/257 |

FOREIGN PATENT DOCUMENTS

EP   2884672 A1   6/2015
JP   2016-029785 A   3/2016

* cited by examiner

*Primary Examiner* — Eugene Yun
(74) *Attorney, Agent, or Firm* — Canon U.S.A., Inc. I.P. Division

(57) ABSTRACT

A communication apparatus that comprises a second coupler to be coupled to a first coupler of a different communication apparatus by electric field coupling and/or inductive coupling, a termination resistor connected to the second coupler and having a resistance value larger than a predetermined value is provided. The communication apparatus receives a signal comprising (i) an output signal that is output from the second coupler in response to input of a transmitted signal to the first coupler, (ii) a signal obtained by performing amplification processing on the output signal, or (iii) a signal obtained by shaping, via a comparator, a signal obtained by performing amplification processing on the output signal, and processes the received signal as a signal that is obtained by reproducing the transmitted signal.

18 Claims, 18 Drawing Sheets

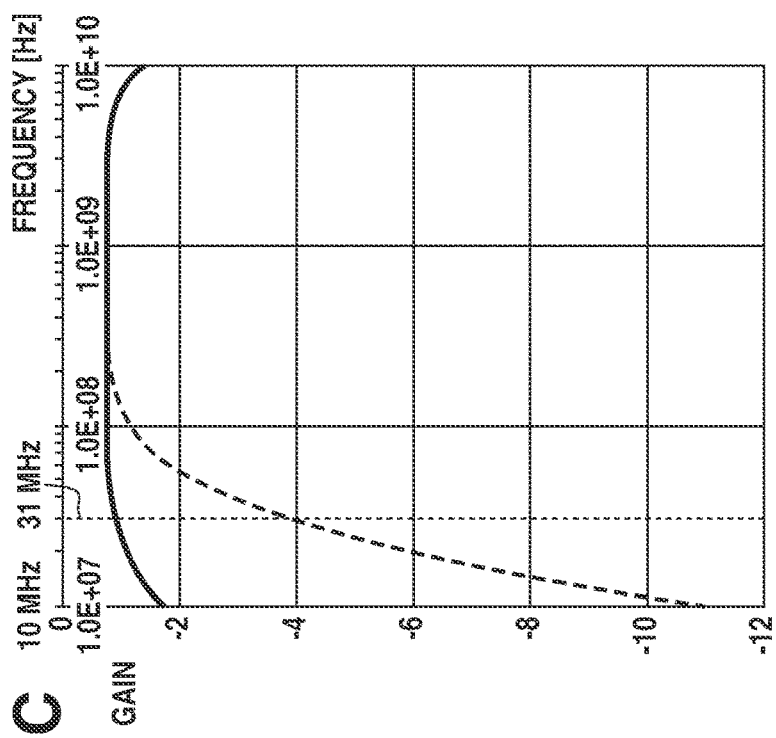
FIG. 16C
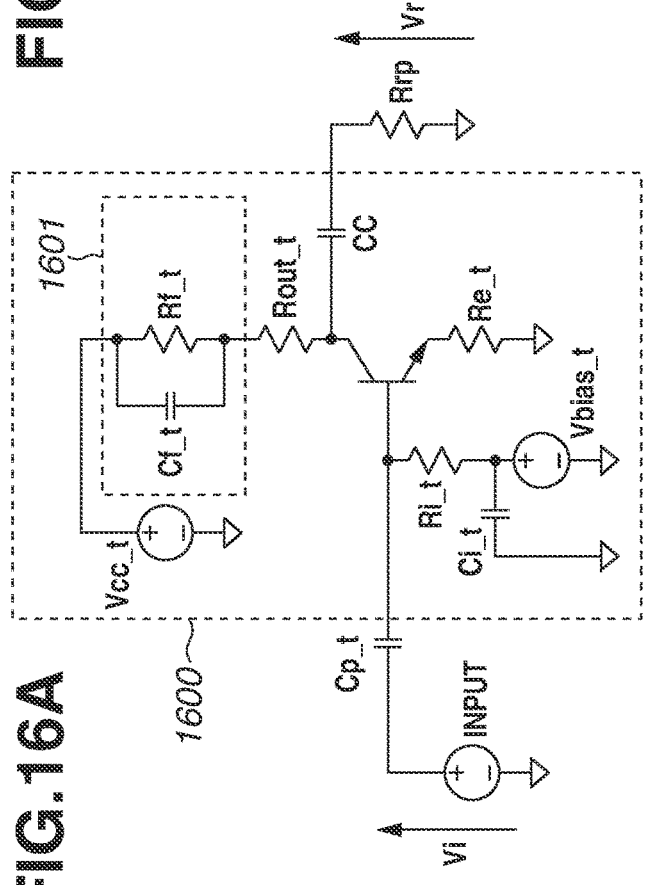
FIG. 16A
| | VALUE 1 | VALUE 2 |
|---|---|---|
| Vcc_t | 5 V | 5 V |
| Vbias_t | 1 V | 1 V |
| Ri_t | 50 Ω | 50 Ω |
| Rout_t | 50 Ω | 50 Ω |
| Re_t | 22 Ω | 22 Ω |
| Rf_t | 300 Ω | 300 Ω |
| Ci_t | 120 pF | 1 uF |
| CC | 0.5 pF | 0.5 pF |
| Cp_t/Ci_t | 1 uF | 1 uF |
FIG. 16B

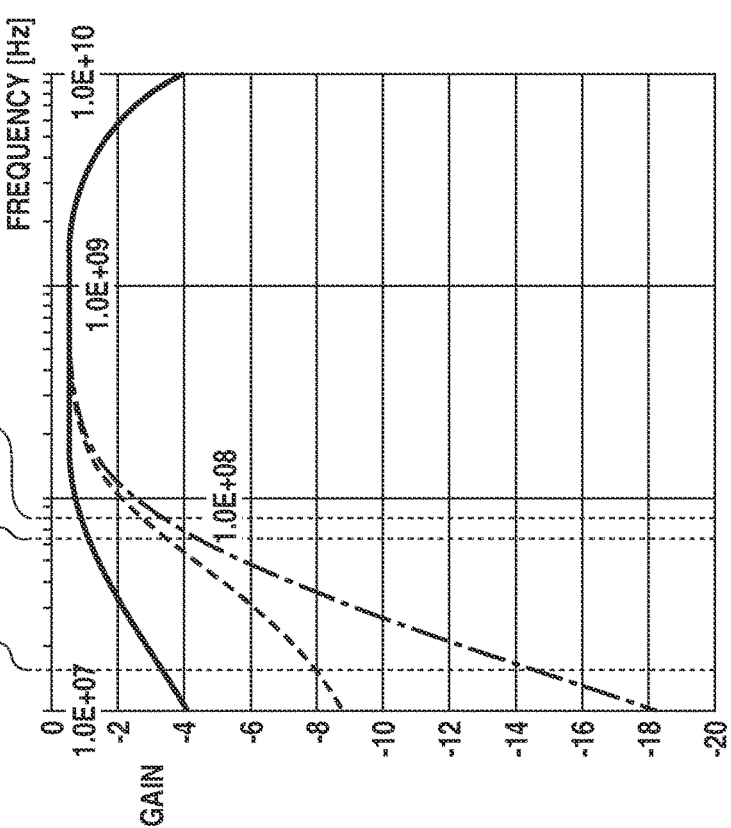
FIG. 17A
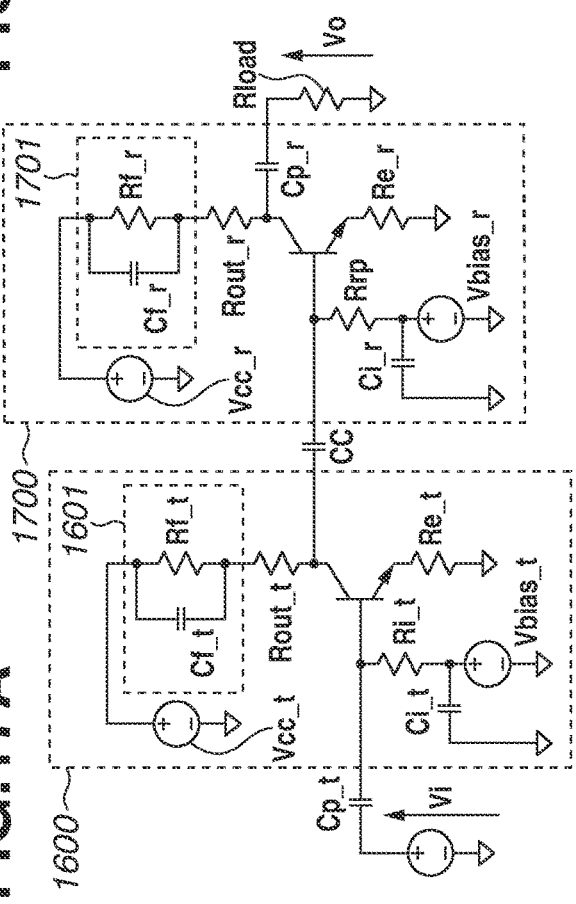
FIG. 17C
| | VALUE 3 | VALUE 4 |
|---|---|---|
| Vcc_r | 5 V | 5 V |
| Vbias_r | 1.3 V | 1.3 V |
| Ri_r | 10 kΩ | 10 kΩ |
| Rout_r | 50 Ω | 50 Ω |
| Re_r | 11 Ω | 11 Ω |
| Rf_r | 300 Ω | 300 Ω |
| Ci_r | 40 pF | 1 uF |
| CC | 0.5 pF | 0.5 pF |
| Cp_r/Ci_r | 1 uF | 1 uF |
FIG. 17B

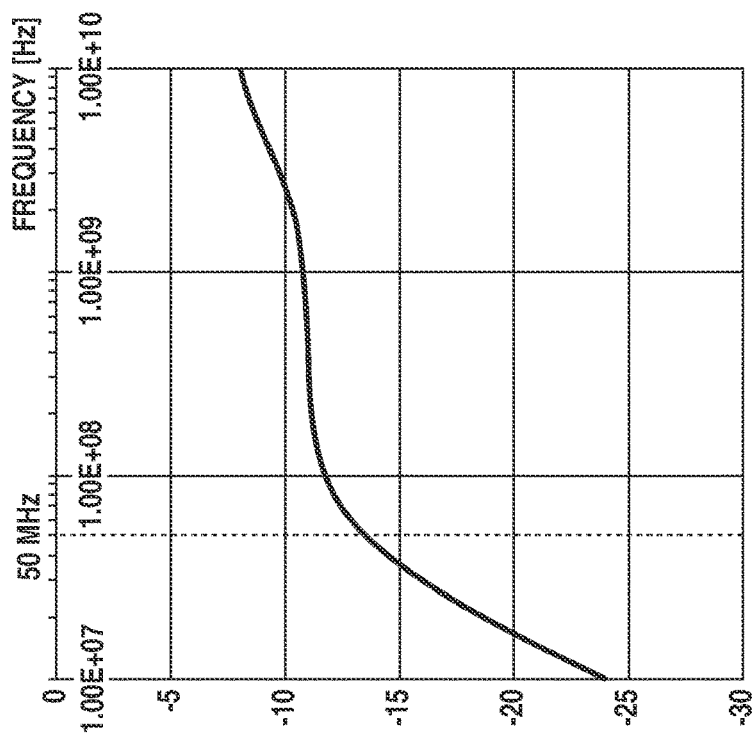
FIG.18C
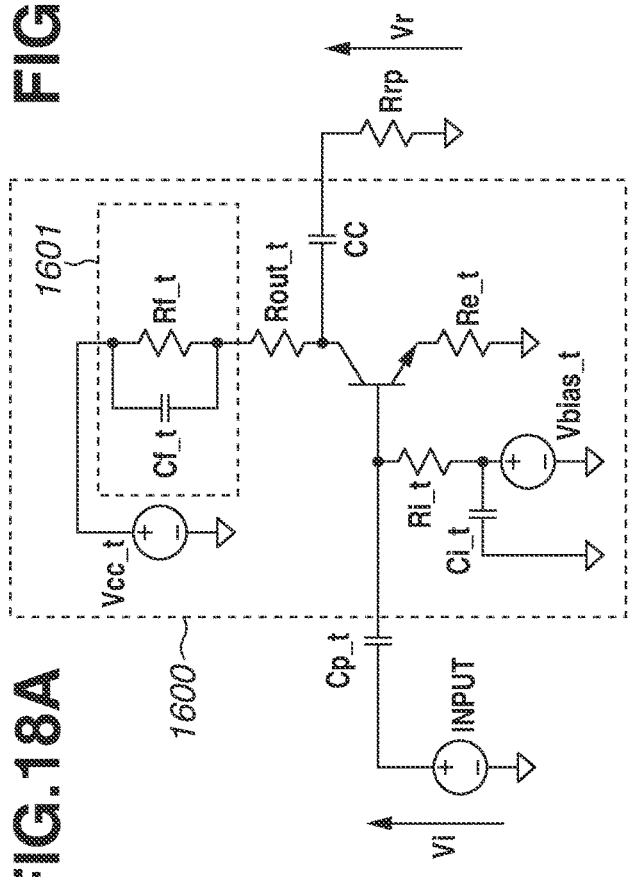
FIG.18A
FIG.18B

COMMUNICATION APPARATUS, WIRELESS COMMUNICATION SYSTEM, AND COMMUNICATION METHOD

BACKGROUND

Field

The present disclosure relates to a communication apparatus, a wireless communication system, and a communication method.

Description of the Related Art

In recent years, there has been proposed a near-field wireless communication system for performing wireless communication based on electromagnetic field coupling between adjacent antennas. In conventional wired connection, connectors or harnesses are used to perform communication between electronic circuit substrates or modules. However, if this communication can be performed wirelessly, the number of parts used in connecting parts of an apparatus can be reduced, and the manufacturing process of the apparatus can be simplified.

Japanese Patent Laid-Open No. 2016-29785 discusses a wireless communication system for transmitting a binary baseband signal by using electromagnetic field coupling in a non-contact manner. In this system, a coupler in a transmitter and a coupler in a receiver are adjacently disposed to face each other, and wireless communication s realized by using electromagnetic field coupling between the couplers. Specifically, when a baseband signal is input to the coupler in the transmitter, the electromagnetic field coupling generates an inexact differential waveform signal in the coupler in the receiver. The receiver shapes this signal by using a hysteresis comparator, to reproduce the transmitted baseband signal.

Recent years have seen an increase in the amount of data transmitted inside an apparatus or between apparatuses, and faster communication is demanded for wireless communication systems. If faster wireless communication is realized based on the method discussed in Japanese Patent Laid-Open No. 2016-29785, disturbance (noise) could occur in the inexact differential waveform due to an impedance mismatch, a parasitic component, etc. If the magnitude of this noise exceeds the comparator's threshold, an error could occur in the signal reproduced by the receiver.

SUMMARY

Various embodiments of the present disclosure are directed to prevention of occurrence of communication errors in wireless communication which are based on electromagnetic field coupling between couplers.

According to one embodiment of the present disclosure, there is provided a communication apparatus that performs wireless communication. The communication apparatus includes: a second coupler configured to be coupled to a first coupler of a different communication apparatus by at least one of electric field coupling or inductive coupling; a termination resistor connected to the second coupler and having a resistance value larger than a predetermined value; a reception unit configured to receive a signal comprising (i) an output signal that is output from the second coupler in response to input of a transmitted signal to the first coupler, (ii) a signal obtained by performing amplification processing on the output signal that is output from the second coupler in response to input of a transmitted signal to the first coupler, or (iii) a signal obtained by shaping, via a comparator; a signal obtained by performing amplification processing on the output signal that is output from the second coupler in response to input of a transmitted signal to the first coupler; and a processing unit configured to process the signal received by the reception unit as a signal that is obtained by reproducing the transmitted signal input to the first coupler.

Further features will become apparent from the following description of exemplary embodiments with reference to the attached drawings.

BRIEF DESCRIPTION OF THE DRAWINGS

FIGS. 16A to 16C illustrate simulation results about effectiveness of a low frequency amplifier circuit according to one embodiment.

FIGS. 17A to 17C illustrate simulation results about effectiveness of a shaping circuit including a low frequency correction circuit according to one embodiment.

FIGS. 18A to 18C illustrate simulation results of a configuration of the low frequency amplifier circuit according to one embodiment.

DESCRIPTION OF THE EMBODIMENTS

Figure 1:
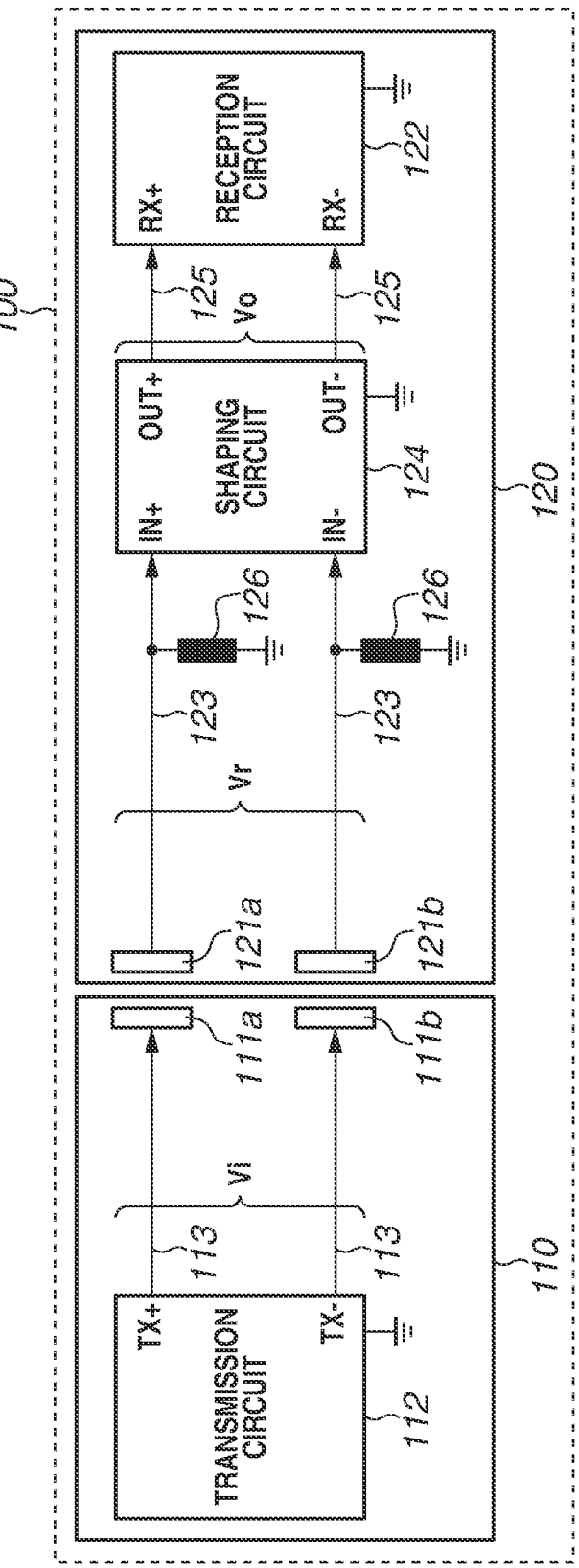
FIG. 1 illustrates a system configuration of a wireless communication system according to one embodiment.

Hereinafter, embodiments will be described in detail with reference to the attached drawings. Note, the following embodiments are not intended to limit the scope of the invention of the present disclosure. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

[System Configuration]

Hereinafter, exemplary embodiments will be described with reference to drawings. FIG. 1 illustrates a configuration example of a wireless communication system 100 (hereinafter referred to as a system 100) according to the present exemplary embodiment. This system 100 includes a wireless communication module 110 (hereinafter referred to as a module 110) and a wireless communication module 120 (hereinafter referred to as a module 120) and performs wireless communication between the modules 110 and 120 in a baseband manner. Namely, each of the modules 110 and 120 functions as a communication apparatus that performs wireless communication in a baseband manner.

The module 110 includes a coupler 111, a transmission circuit 112, and transmission lines 113. The module 120 includes a coupler 121, a shaping circuit 124, a reception circuit 122, transmission lines 123, transmission lines 125, and termination resistors 126. The termination resistors 126 are connected to the transmission lines 123 between the coupler 121 and the shaping circuit 124. The coupler 111 includes two separate electrodes 111a and 111b. Likewise, the coupler 121 includes two separate electrodes 121a and 121b. The coupler 111 in the module 110 and the coupler 121 in the module 120 are adjacently disposed to face each other and are coupled with each other by electromagnetic field. More specifically, the electrodes 111a and 121a are disposed to face each other, and the electrodes 111b and 121b are disposed to face each other.

The electromagnetic field coupling according to the present exemplary embodiment signifies both electric field coupling and inductive coupling. Namely, the wireless communication between the modules 110 and 120 may be performed by electric field coupling and/or inductive coupling. The following description assumes that the couplers 111 and 121 are coupled with each other mainly by electric field coupling.

The transmission circuit 112 inputs transmitted signals to the coupler 111 via the transmission lines 113. The present exemplary embodiment assumes that the transmitted signals input to the coupler 111 are baseband signals that do not need modulation of carrier waves. In addition, the present exemplary embodiment assumes that the transmitted signals transmitted by the transmission circuit 112 and the received signals received by the reception circuit 122 are differential signals. Namely, opposite phase signals are input to the electrodes 111a and 111b, and opposite phase signals are output from the electrodes 121a and 121b. When these transmitted signals are input to the coupler signals are output from the coupler 121 by the effect of electric field coupling. The shaping circuit 124 shapes the signals input from the coupler 121 via the transmission lines 123 and outputs these signals to the reception circuit 122 via the transmission lines 125. The reception circuit 122 receives the signals shaped by the shaping circuit 124 and processes these signals as received signals that are obtained by reproducing the transmitted signals.

Figure 2A:
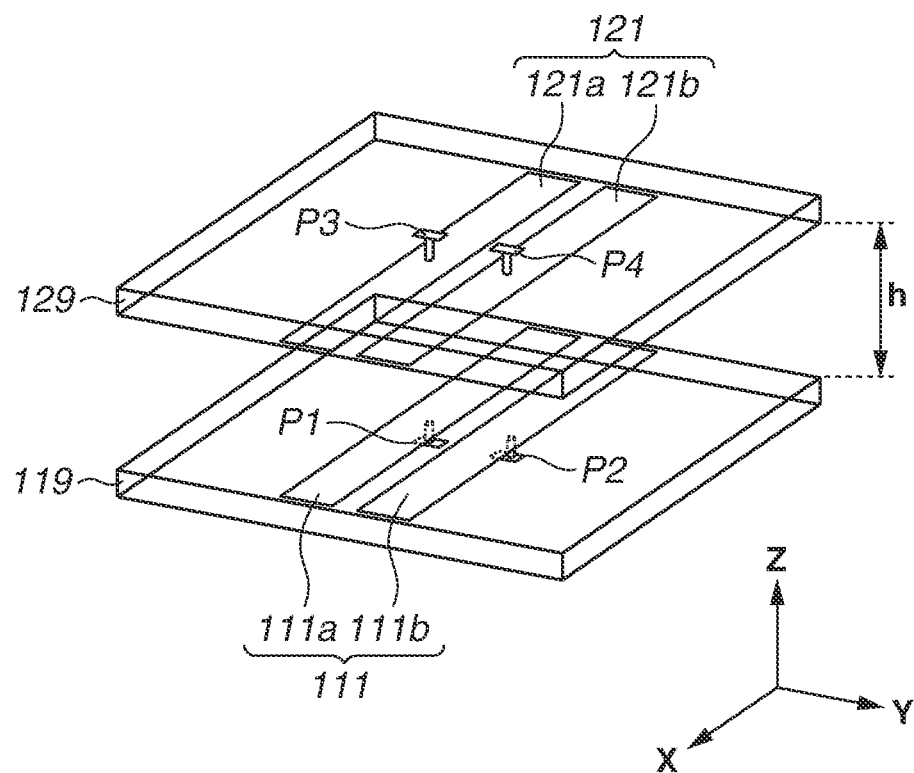
FIGS. 2A and 2B illustrate structures of couplers according to one embodiment.
Figure 2B:
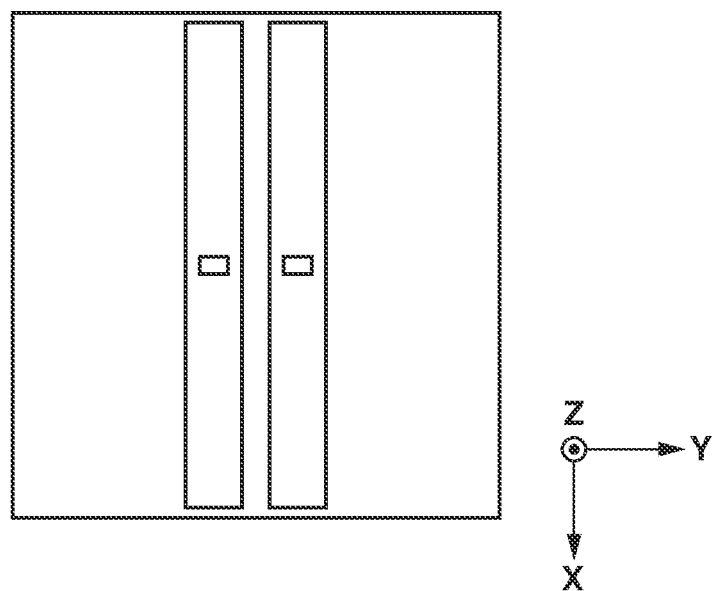

Next, structures of the couplers 111 and 121 according to the present exemplary embodiment will be described with reference to FIGS. 2A and 2B. FIG. 2A is a perspective view illustrating structures of the couplers 111 and 121. FIG. 2B is a plan view illustrating, as an example, the structures of the couplers 111 and 121 seen from the Z axis direction. The electrodes 111a and 111b are connected to the transmission lines 113 at connection points (feeding points) P1 and P2, respectively. Likewise, the electrodes 121a and 121b are connected to the transmission lines 123 at connection points (feeding points) P3 and P4, respectively.

The electrodes 111a and 111b are formed on one surface of a dielectric 119, and the electrodes 121a and 121b are formed on one surface of a dielectric 129 (on the surface facing the dielectric 119). According to the present exemplary embodiment, for example, the couplers 111 and 121 are formed as patterns on substrates such as rigid substrates or flexible substrates. Alternatively, the couplers 111 and 121 may be formed by sheet-metal processing or the like. As illustrated in FIGS. 2A and 2B, when the couplers 111 and 121 are adjacently disposed to face each other, electric field coupling occurs between the couplers 111 and 121.

The system 100 having the above configuration can be implemented, for example, on an imaging apparatus or a machine that is driven by a motor. If the system 100 is implemented on a camera that is functioning as an imaging apparatus, the module 110 may be included in the main unit of the camera and the module 120 may be included in an accessory part of the camera, for example. In this case, transmitted signals that represent image data acquired by the main unit may be transmitted wirelessly to the accessory part. Other than the camera, a computed tomography (CT) apparatus may be used as the imaging apparatus. Specifically, the module 110 may be included in a rotary part of the CT apparatus and the module 120 may be included in a fixed part of the CT apparatus. In this case, transmitted signals that represent image data acquired by the rotary part may be transmitted wirelessly to the fixed part.

In addition, if the system 100 is implemented on a robot arm as a machine that is driven by a motor, the module 110 may be included in an arm part and the module 120 may be included in a hand part. In this case, control signals for controlling an operation of the hand part may be transmitted wirelessly from the arm part. The module 120 may control the operation of the hand part in accordance with the received signals received by the reception circuit 122. Other than the robot arm, a semiconductor exposure apparatus may be used as a machine that is driven by a motor. Specifically, the module 120 may control an operation of a movable stage part of the exposure apparatus in accordance with the wirelessly received signals. As another example, the module 110 may be included in the main unit of an inkjet printer, and the module 120 may be included in a print head part. In this case, the module 120 may control the ink discharge in accordance with the wirelessly received signals. The above described objects and systems are merely provided as examples of the types of systems in which embodiments of the system 100 can be implemented. It is noted that system 100 may be implemented on objects and systems other than the above described examples.

Signal Waveforms

Figure 3A:
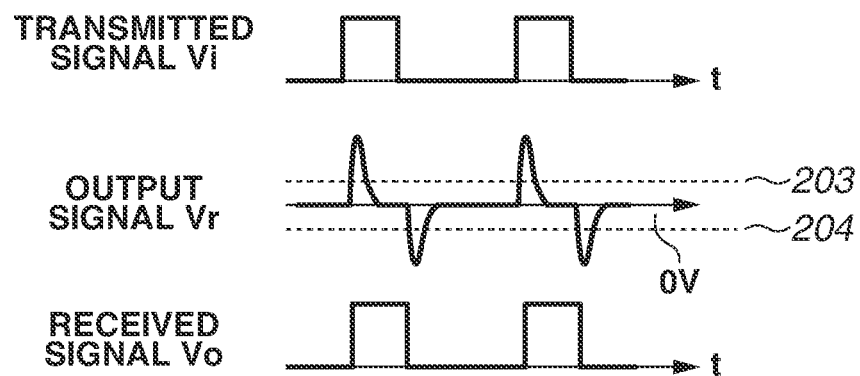
FIGS. 3A to 3C illustrate examples of electric signals transmitted in the wireless communication system according to one embodiment.
Figure 3B:
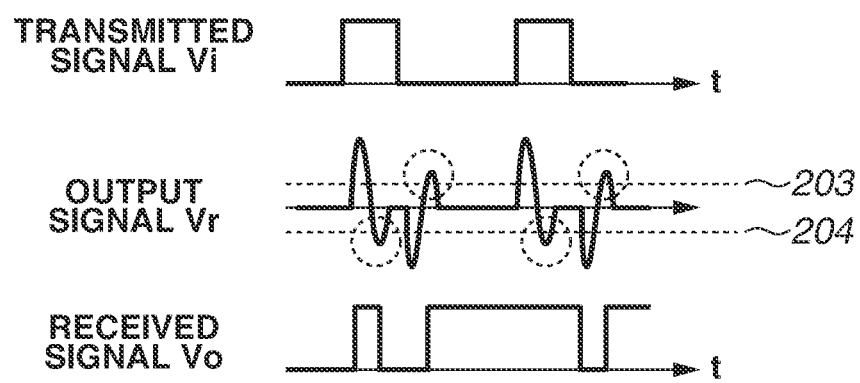
Figure 3C:
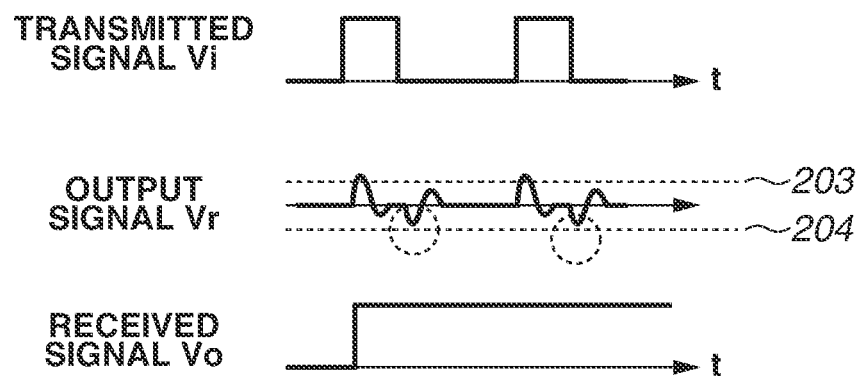

FIGS. 3A to 3C illustrate examples of signal waveforms transmitted in the system 100. The following description assumes that each of the termination resistors 126 has 50Ω as a resistance value Rrp. In FIGS. 3A to 3C, the horizontal axis represents time, and the vertical axis represents the signal voltage level. A transmitted signal Vi denotes a signal that is input to the coupler 111, and an output signal Vr denotes a signal that is output from the coupler 121. A received signal Vo denotes a signal that is input to the reception circuit 122.

The transmission circuit 112 inputs, as the transmitted signal Vi, a binary baseband signal indicating "1" or "0" to the coupler 111. Since the couplers 111 and 121 are coupled with each other by electric field coupling, the couplers 111 and 121 exhibit transmission characteristics that are similar to those of a high-pass filter (HPF) which achieves a low degree of coupling in a low frequency and a high degree of coupling in a high frequency. Thus, a high-frequency component of the transmitted signal Vi is transmitted. Ideally, as illustrated in FIG. 3A, the output signal Vr represents an inexact differential waveform of a rectangular wave that is the waveform of the transmitted signal Vi. The shaping circuit 124 performs signal shaping on the output signal Vr, to reproduce the binary baseband signal output by the transmission circuit 112. The shaping circuit 124 includes a hysteresis comparator having thresholds 203 and 204, for example. If the input signal exceeds the threshold 203, the hysteresis comparator outputs "1" thereafter. If the input signal falls below the threshold 204, the hysteresis comparator outputs "0" thereafter. In this way, the module 120 receives the signals transmitted from the module HO.

It is ideal that the output signal Vr has an inexact differential waveform of the transmitted signal Vi, as illustrated in FIG. 3A. However, in practice, waveform disturbance (noise) as illustrated by dotted circles in FIG. 3B occurs in the output signal Vr due to an impedance mismatch, a parasitic component; etc. of the circuit. If the voltage level of the noise exceeds the threshold 203 or 204 of the shaping circuit 124, the shaping circuit 124 is unable to reproduce the transmitted signal Vi accurately, and the reception circuit 122 receives an erroneous received signal Vo. As a result, a communication error occurs in the wireless communication between the modules 110 and 120. In addition, since the comparator of the shaping circuit 124 has hysteresis characteristics, once a communication error occurs, this impact lasts for a certain period of time thereafter.

If the distance between the couplers 111 and 121 is extended, namely, if the degree of coupling between the couplers 111 and 121 is reduced, since the voltage level of the noise is also reduced, the above thresholds are not exceeded. However, if the degree of coupling is excessively reduced, as illustrated in FIG. 3C, the peaks of the voltage level of the output signal Vr other than those of the noise of the output signal Vr do not exceed the thresholds, either. As a result, the received signal Vo does not represent accurate reproduction of the transmitted signal Vi, resulting in a communication error. It is not easy to strictly control the thresholds or the voltage level in such a manner that the strength of the desired signal is allowed to reach the thresholds or more and the strength of the noise is maintained below the thresholds, to realize error-free communication. In particular; this control becomes more difficult in a case where the positional relationship between the couplers 111 and 121 changes since the degree of coupling could also change.

Figure 4A:
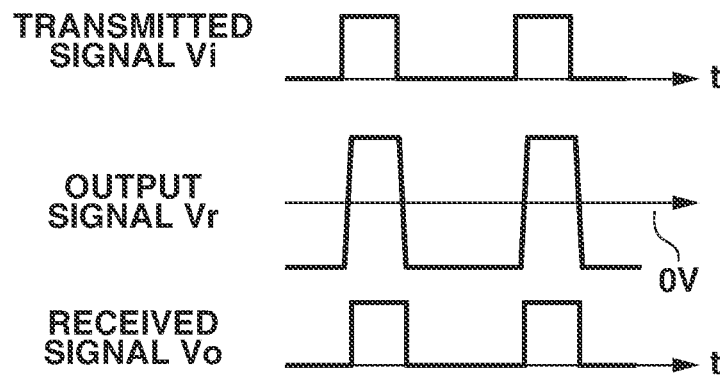
FIGS. 4A to 4C illustrate examples of electric signals transmitted in the wireless communication system according to one embodiment.
Figure 4B:
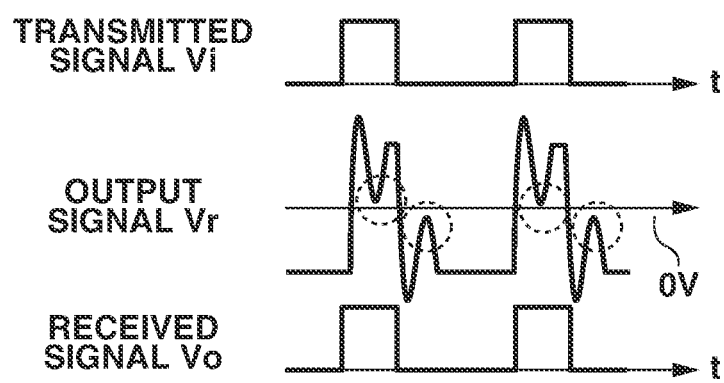
Figure 4C:
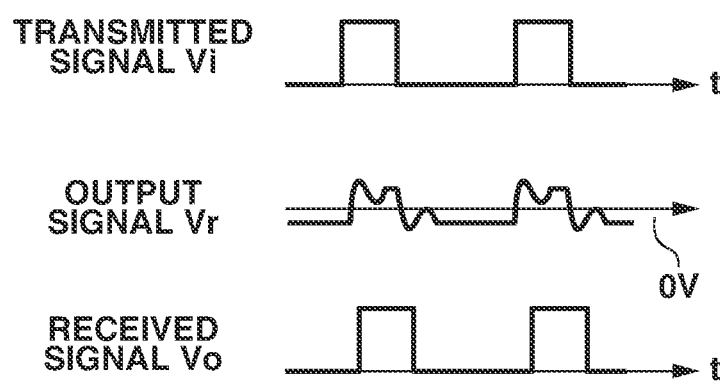

FIGS. 4A to 4C illustrate other examples of signal waveforms transmitted in the system 100. In these examples, each of the termination resistors 126 has 10 kΩ as the resistance value Rrp, which is higher than 50Ω in the examples in FIGS. 3A to 3C. Thus, due to the capacitive component impedance caused by the coupling between the couplers 111 and 121, the resistance value Rrp becomes larger also in the low frequency. Consequently, the low-frequency component of the transmitted signal is also transmitted to the shaping circuit 124, and ideally, the waveform of the output signal Vr output from the coupler 121 in response to input of the transmitted signal Vi to the coupler 111 becomes approximately rectangular as illustrated in FIG. 4A. Namely, by using the termination resistors 126 having a higher resistance value, reduction in the low-frequency component of the signal transmitted from the coupler 111 to the coupler 121 by electromagnetic field coupling is controlled.

The shaping circuit 124 which shapes the output signal Vr and outputs the received signal Vo includes, for example, an amplification circuit that performs amplification processing on the output signal Vr. Namely, the reception circuit 122 receives the received signal Vo obtained by performing the amplification processing on the output signal Vr output from the coupler 121. The reception circuit 122 may bypass the shaping circuit 124 and directly receive the output signal Vr output from the coupler 121 as the received signal Vo.

FIG. 4B illustrates waveforms when noise occurs in the output signal Vr. To remove the impact of this noise, the shaping circuit 124 includes a comparator whose threshold is 0 V and that does not have hysteresis characteristics. Namely, the comparator that does not have hysteresis characteristics shapes the output signal Vr output from the coupler 121, and the reception circuit 122 receives the resultant received signal Vo. With this configuration, error-free communication can be performed unless large noise that causes the signal to become an inverse voltage occurs (occurrence of a zero cross). In addition, since reduction in the low-frequency component of the signal transmitted from the coupler 111 to the coupler 121 by electromagnetic field coupling is controlled (that is, even at timing when noise occurs in the output signal Vr, the impact of the transmitted signal Vi significantly remains), the zero cross based on noise occurs less, compared with the case illustrated in FIG. 3B.

Even when the degree of coupling between the couplers 111 and 121 changes, the voltage level of the noise in the output signal Vr changes approximately in proportion to the voltage levels of the other peaks in the output signal Vr. Thus, with the above configuration in which the threshold of the comparator is set to 0 V, the zero cross occurs less. Thus, even in a case where the positional relationship between the couplers 111 and 121 changes, stable communication characteristics can be obtained without strictly controlling the thresholds or the voltage level based on the change of the degree of coupling. In other words, the communication coverage can be expanded even when displacement between the couplers occurs. In addition, even if a communication error occurs, since the comparator of the shaping circuit 124 does not have hysteresis characteristics, the impact of the communication error does not last for a long time. In addition, since there is no need to use expensive hysteresis comparator compatible with high-speed communication for the shaping circuit 124, the production cost of the system can be reduced.

The method for obtaining the received signal Vo by shaping the output signal Vr is not limited to one using a comparator that does not have hysteresis characteristics. For example, the shaping circuit 124 may include an amplification circuit. In this case, the amplification circuit shapes the output signal Vr output from the coupler 121, and the reception circuit 122 may receive the received signal Vo shaped by the amplification circuit. In a case where an amplification circuit is used for signal shaping, it is possible to use a limiting amplifier that performs control processing in such a manner that the output level becomes a predetermined value when the input signal is a reference level or more. In this case, it is possible to maintain the maximum amplitude of the whole waveform at a certain level while sufficiently amplifying the signal of noise part. Examples of the amplification circuit is not limited to a limiting amplifier. An amplifier that simply amplifies the input signal is also applicable. Alternatively, for example, the shaping circuit 124 may include a comparator that has hysteresis characteristics. In this case, the hysteresis comparator shapes the output signal Vr output from the coupler 121, and the reception circuit 122 receives the received signal Vo shaped by the comparator. Still alternatively, the shaping circuit 124 may include both the amplification circuit and the comparator. That is, amplification processing may be performed on the output signal Vr output from the coupler 121, and the comparator may shape the amplified output signal Vr. Finally, the reception circuit 122 may receive the received signal Vo shaped by the comparator.

[Simulation Results]

Figure 5A:
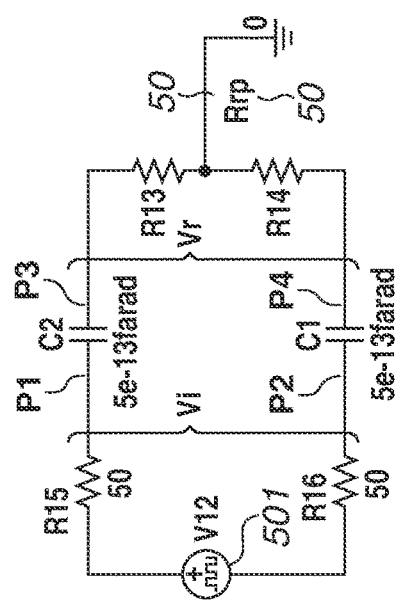
FIGS. 5A to 5C illustrate simulation results of electric signals transmitted in the wireless communication system according to one embodiment.

Simulation results of signal waveforms based on the configuration of the system 100 described with reference to FIGS. 3A to 3C and simulation results of signal waveforms based on the configuration of the system 100 described with reference to FIGS. 4A to 4C will be compared with each other with reference to FIGS. 5A to 5C and FIGS. 6A to 6C. First, simulation results obtained by using the system 100 including the termination resistors 126 having a small resistance value described with reference to FIGS. 3A to 3C will be described with reference to FIGS. 5A to 5C. FIG. 5A illustrates an equivalent circuit model of the system 100 used in this simulation. This model has a signal source 501 and outputs a pseudo-random signal (5 Gbps) of 2 Vpp with a differential output of 100Ω. In addition, the couplers 111 and 121 are each represented by an ideal capacitor of 0.5 pF, and the resistance value Rrp of the termination resistor 126 is set to a pure resistance of 50Ω (a differential of 100Ω).

Figure 5C:
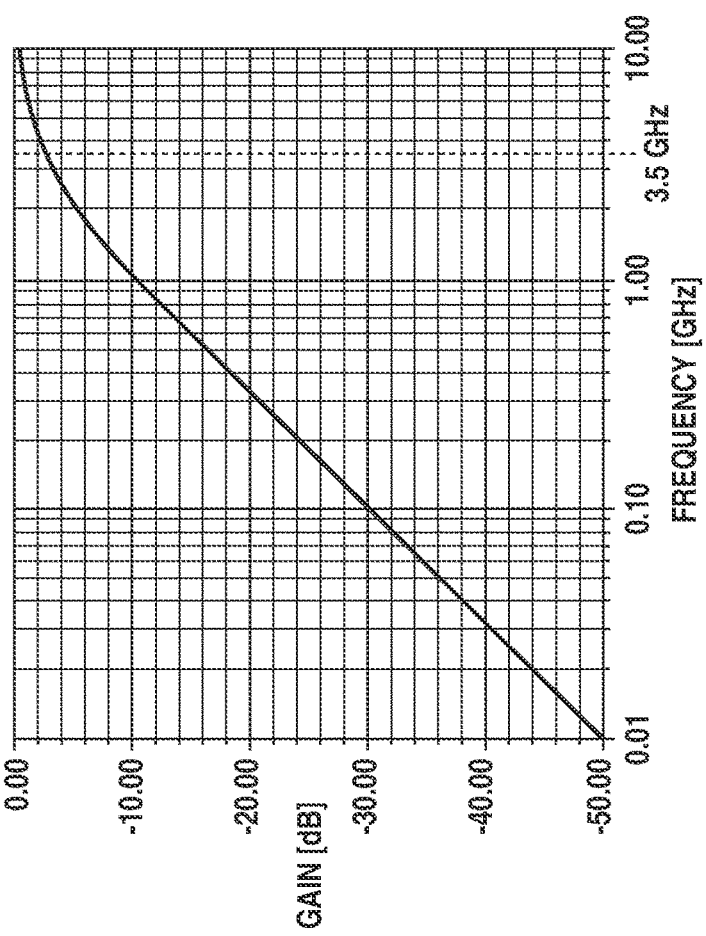
Figure 5B:
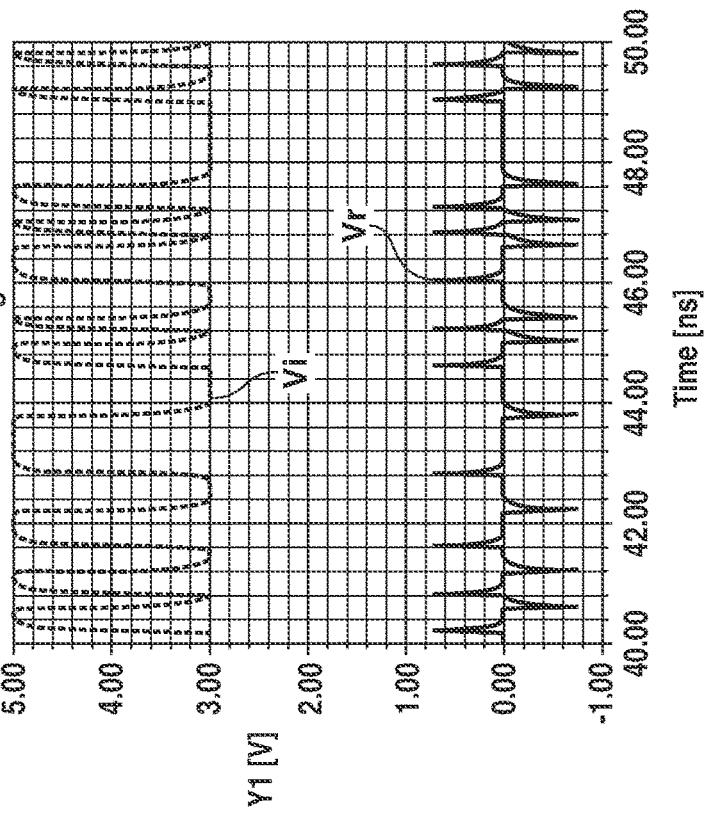

FIG. 5B illustrates simulation results of waveforms of the transmitted signal Vi and the output signal Vr of this model. FIG. 5C illustrates transmission characteristics (S-parameter, Sdd21) from P1 and P2 to P3 and P4. In FIG. 5C, the horizontal axis represents the frequency, and the vertical axis represents the gain. As can be seen from FIG. 5C, the transmission characteristics of this model represent inexact differential characteristics in which the gain increases at 6 dB/oct with a rise in frequency. Therefore, as illustrated in FIG. 5B, the output signal Vr is seen as an inexact differential waveform of the transmitted signal Vi.

Figure 6A:
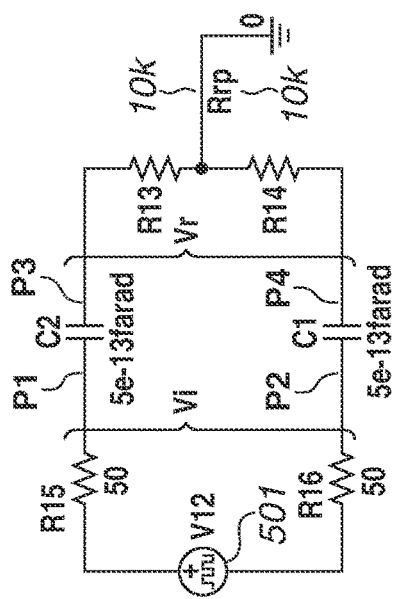
FIGS. 6A to 6C illustrate simulation results of electric signals transmitted in the wireless communication system according to one embodiment.

Next, simulation results obtained by using the system 100 including the termination resistors 126 having a large resistance value described with reference to FIGS. 4A to 4C will be described with reference to FIGS. 6A to 6C. FIG. 6A illustrates an equivalent circuit model of the system 100 used in this simulation. In this model, the resistance value Rrp of the termination resistor 126 is set to a pure resistance of 10 kΩ (a differential of 20 kΩ).

Figure 6B:
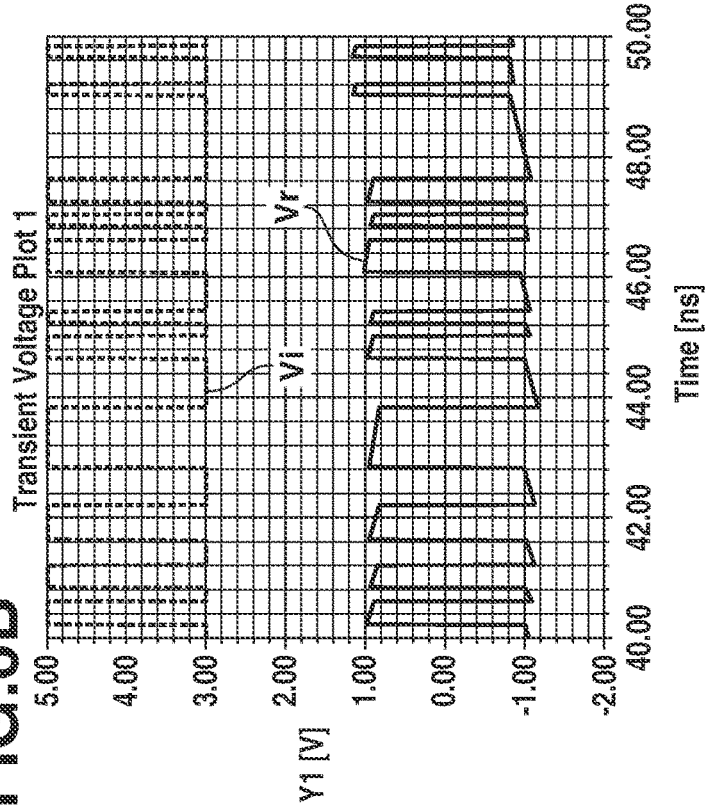

FIG. 6B illustrates simulation results of waveforms of the transmitted signal Vi and the output signal Vr of this model. FIG. 6C illustrates transmission characteristics (S-parameter, Sdd21) from P1 and P2 to P3 and P4. In FIG. 6C, the horizontal axis represents the frequency, and the vertical axis represents the gain. As can be seen from FIG. 6C, this model has approximately flat transmission characteristics also in the low frequency, compared with the model illustrated in FIGS. 5A to 5C. Therefore, as illustrated in FIG. 6B, the output signal Vr has a rectangular waveform, which is approximately the same waveform as that of the transmitted signal Vi. As can be seen from these simulation results, the system 100 corresponding to the examples in FIGS. 6A to 6C can expand the communication coverage, compared with the system 100 corresponding to the examples in FIGS. 5A to 5C.

Figure 6C:
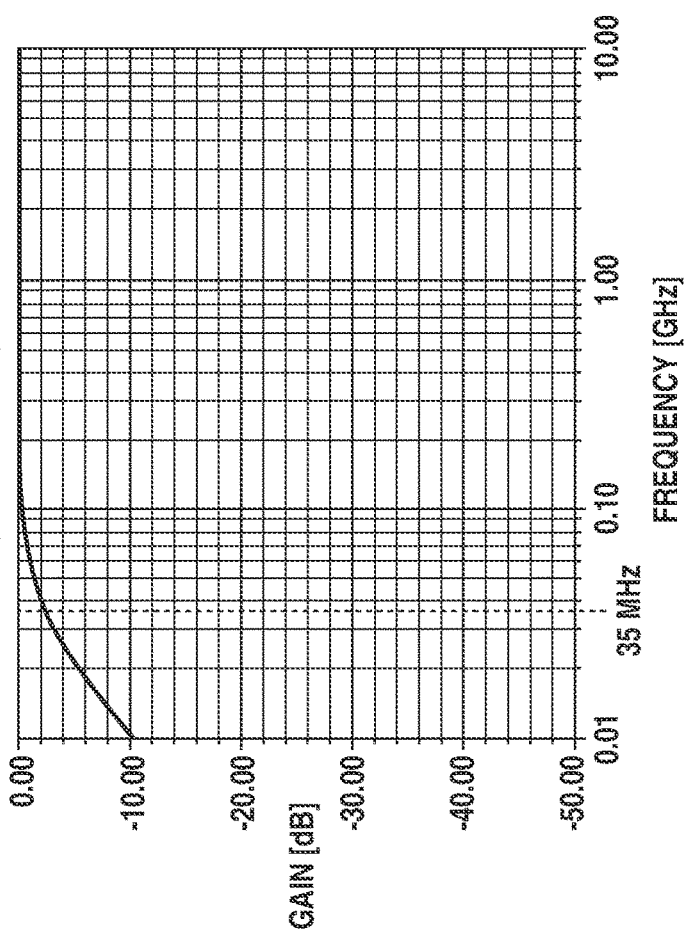

In the simulations illustrated in FIGS. 5A to 5C and FIGS. 6A to 6C, analyses were made assuming that the couplers 111 and 121 are ideal capacitors and the termination resistors 126 are pure resistors. However, in practice, the couplers 111 and 121 are converted into inductive components in the high frequency. In addition, a parasitic component generated by a peripheral circuit, a wiring pattern, etc. is connected in series or in parallel to the termination resistors 126. Therefore, in practice, the ideal transmission characteristics as illustrated in FIGS. 5c and 6C cannot be obtained. In particular, disturbance occurs in the high frequency, and noise occurs in the output signal Vr as described above. However, even in such cases, a similar effect can be obtained. By increasing the resistance value of the termination resistor 126, the flat transmission characteristics can be obtained also in the low frequency, compared with the case where a small resistance value is set.

To achieve the above effect, the resistance value Rrp of the termination resistor 126 is set to a larger value such that the output signal Vr output from the coupler 121 has an approximately rectangular waveform. Specifically, the resistance value Rrp of the termination resistor 126 is set to a value such that the time constant determined based on the coupling capacitance between the couplers 111 and 121 and the resistance value of the termination resistor 126 is larger than at least 1 UI (a period in which 1-bit data is input) of the transmitted signal. Namely, in a case where the resistance value of the termination resistor 126 is represented by Rrp, the coupling capacitance between the couplers 111 and 121 is represented by C, and the fundamental frequency, which is the band of a baseband signal as a transmitted signal, is represented by f1, the resistance value Rrp of the termination resistor 126 is set to satisfy $Rrp > 1/(2\pi f1 \times C)$. For example, when the maximum communication speed is 5 Gbps, the fundamental frequency f1 is 2.5 GHz.

Depending on the coding scheme of the communication, there is a restriction on the number of consecutive bits of the same code in the transmitted signal. For example, if 8B10B is used for the coding scheme, the maximum number of consecutive bits of the same code (either "1" or "0") is 5. Thus, when the low frequency of a transmitted signal in accordance with this restriction is f2, if the resistance value Rrp of the termination resistor 126 is set to satisfy $Rrp > 1/(2\pi f2 \times C)$, the communication performance is further improved. For example, when the maximum communication speed is 5 Gbps and the coding scheme is 8B10B, the low frequency f2 is 0.5 GHz (=2.5 GHz/5).

The resistance value Rrp of the termination resistor 126 is not limited to the above example. A different resistance value Rrp may be set as long as the resistance value Rrp is larger than a predetermined value based on the requirements of an apparatus on which the system 100 is implemented. If the resistance value Rrp is small, a communication error could occur more easily since the low-frequency component of the wirelessly transmitted signal is reduced. However, when the system 100 is implemented on an apparatus having an error correction function or an apparatus that does not need high communication accuracy, a resistance value Rrp smaller than the above examples may be set.

[Circuit Configuration]

Figure 11:
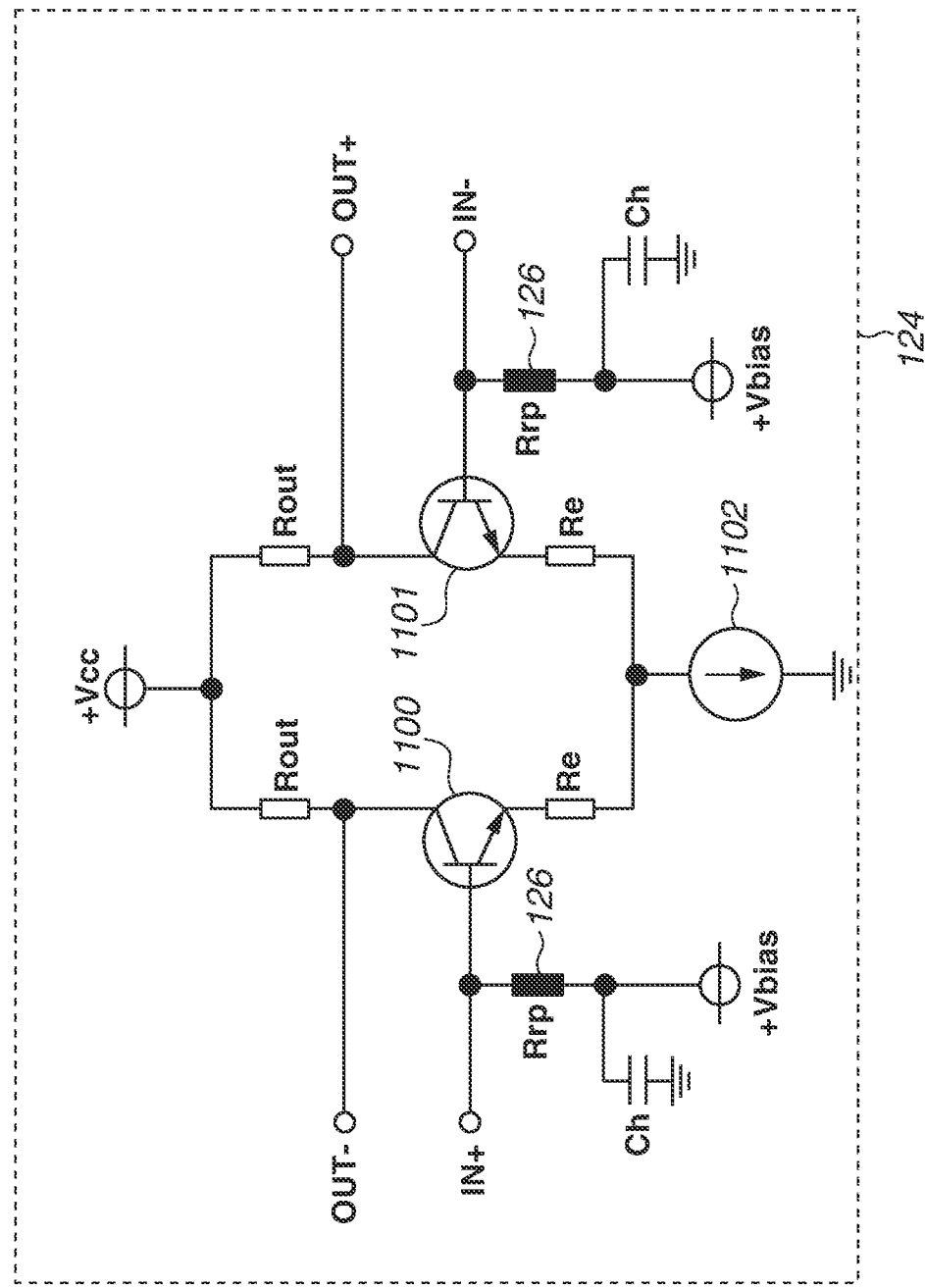
FIG. 11 illustrates a configuration example of a shaping circuit according to one embodiment.

FIG. 11 illustrates an example of a specific configuration of the shaping circuit 124 in the system 100. Here, description will be given on the assumption that the shaping circuit 124 includes the termination resistors 126. In the example illustrated in FIG. 11, the shaping circuit 124 functions as an amplification circuit not including a comparator. Specifically, the shaping circuit 124 is a differential amplifier circuit including a transistor 1100, a transistor 1101, and a current source 1102. A termination resistor 126 having a large resistance value Rrp and a capacitor Ch are inserted between an input terminal +IN of the shaping circuit 124 and a base terminal of the transistor 1100. Likewise, a termination resistor 126 having a large resistance value Rrp and a capacitor Ch are inserted between an input terminal −IN of the shaping circuit 124 and a base terminal of the transistor 1101.

The capacitor Ch is inserted such that the input impedance of the shaping circuit 124 is recognized as Rrp in the signal band, regardless of the output impedance of +Vbias that sets a bias voltage needed for the base terminal of each of the transistors 1100 and 1101. Therefore, the capacitance of the capacitor Ch is set to such a value that the impedance is sufficiently small in the band of the signals transmitted. In addition, +Vbias is set to a voltage value such that the transistors 1100 and 1101 mainly operate in the active region.

With the above configuration, the shaping circuit 124, whose input impedance ideally becomes Rrp, can be implemented. However, in practice, due to parasitic components such as the capacitances of the transistors (the capacitance between the base and the emitter, the capacitance between the base and the collector, etc.) and the wiring pattern, the input impedance will be a value affected by these parasitic components. If the resistance value Rrp of each of the termination resistors 126 is large, multiple reflection occurs in the transmission lines 123 between the coupler 121 and the shaping circuit 124. As a result, noise could occur. Therefore, the transmission lines 123 could be shortened.

A resistor Rout is for setting the output impedance of the shaping circuit 124 and is set to 50Ω, for example. A resistor Re is for controlling the amplification degree of this differential amplifier circuit and is set to an appropriate value in accordance with the strength of the signals transmitted. Depending on the strength of the signals transmitted, the shaping circuit 124 does not need to include the resistors Re. Alternatively, the shaping circuit 124 may include a capacitor inserted in parallel to a resistor Re to increase the gain in the high frequency.

In this example, the shaping circuit 124 is a grounded-emitter amplifier circuit. However, the configuration of the shaping circuit 124 is not limited to this example. The shaping circuit 124 may be a grounded-base or grounded-collector (emitter follower) differential amplifier circuit. Alternatively, the shaping circuit 124 may be a comparator circuit or a limiting amplifier, instead of a simple amplifier circuit. Since the grounded-base circuit and the grounded-collector circuit do not have the mirror effect, it is possible to prevent the increase of the parasitic capacitances of the transistors. In this way, a higher input impedance can be realized, and the low-frequency side of the communication band can be expanded. While the differential amplifier circuit has been described as the example of the shaping circuit 124 with reference to FIG. 11, the shaping circuit 124 is not limited to this example. The shaping circuit 124 may include a single-ended amplifier circuit for each of the differential signals.

In addition, if the level of a signal output from output terminals +out and −out of the circuit illustrated in FIG. 11 is less than a specified value, the shaping circuit 124 may further include an amplifier circuit such as a limiting amplifier or a comparator in a downstream stage thereof.

In addition, the system 100 may include a shield member that surrounds the couplers 111 and 121 or another circuit. If the resistance value Rrp of the termination resistors 126 is increased, the system 100 will be more easily affected by external noise. By arranging such a shield member can prevent the communication quality from deteriorating due to the impact of the external noise. In addition, the system 100 may include a ferrite bead connected in series to the termination resistor 126. By setting a high impedance in a desired band with the effect of this ferrite bead, the band can be flattened further. While the shaping circuit 124 and the reception circuit 122 are separately disposed in the drawings described above, the reception circuit 122 may include the shaping circuit 124.

Figure 7:
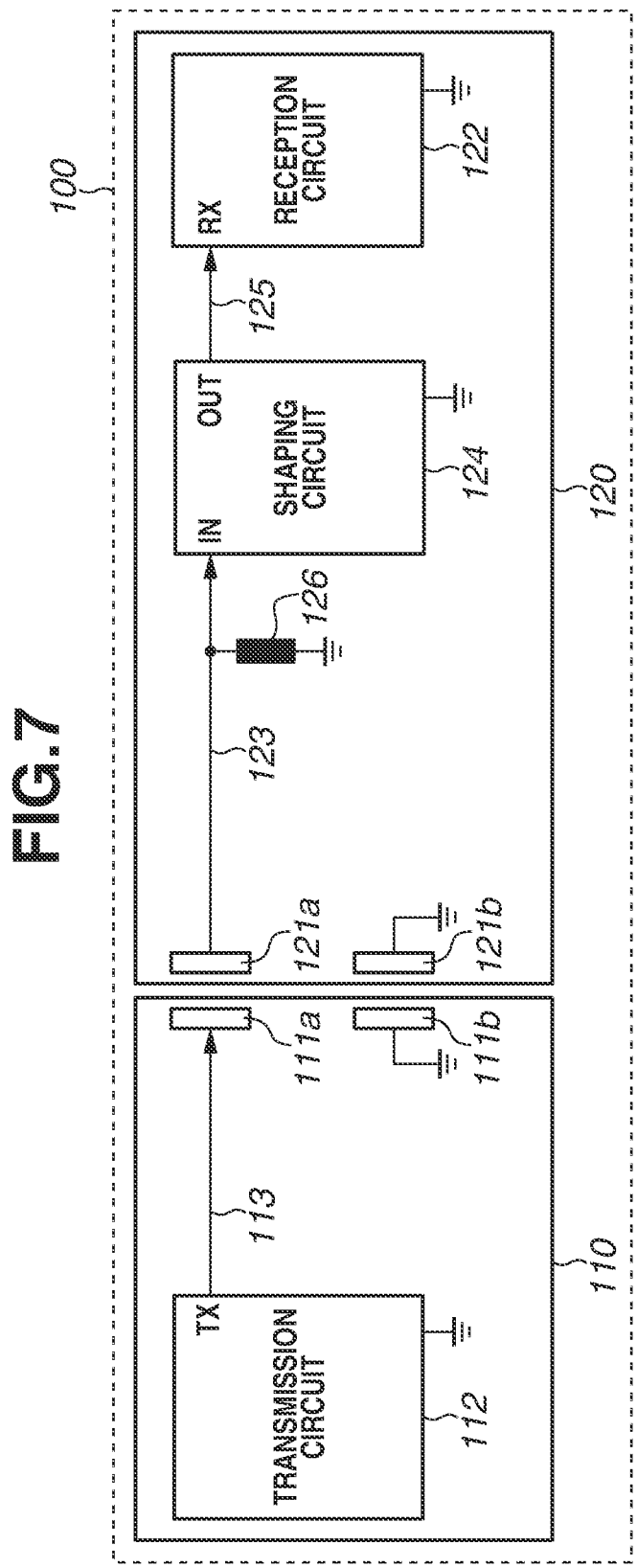
FIG. 7 illustrates a system configuration of a wireless communication system when single-ended transmission is performed according to one embodiment.

The following description of the present exemplary embodiment will mainly be made in a case in which differential baseband signals are transmitted in the system 100. However, the present exemplary embodiment is not limited to such a case. The transmitted signals and the received signals may be single-ended signals. In this case, the system 100 has a configuration as illustrated in FIG. 7, for example, and the shaping circuit 124 has a configuration suitable for single-ended transmission. In addition, the following description of the present exemplary embodiment will mainly be made on a case in which the transmitted signals and the received signals are binary baseband signals. However, the present exemplary embodiment is not limited to such a case. The transmitted signals and the received signals may be multi-valued (three-valued or more) signals. Alternatively, modulation signals obtained by modulating the amplitude, the frequency, the phase, etc. of carrier waves based on transmitted data may be transmitted, for example.

[Correction of Low-Frequency Signal]

As described with reference to FIG. 6C, it is desirable that the transmission characteristics in the system 100 be flat in the frequency band corresponding to a signal transmitted. In particular, when the transmitted signal is transmitted as a baseband signal without performing modulation, it is desirable that the transmission characteristics be flat in a wider band. By making the couplers 111 and 121 physically smaller and reducing the inductive components in the high frequency, the band on the high frequency side can be expanded. However, if the couplers are made smaller, the coupling capacitance between the couplers is also made smaller. As a result, the cutoff frequency on the low frequency side is shifted to the higher frequency side. In other words, the band on the low frequency side is narrowed.

If the distance between the couplers is shortened, the band on the low frequency side can be expanded since the coupling capacitance between the couplers can be increased. However, if the distance between the couplers is shortened, mechanical problems such as mechanical strength and tolerance could occur more easily. Hereinafter, a configuration that can expand the band on the low frequency side will be described. In this configuration, the system 100 includes a low frequency correction circuit that amplifies a signal having a frequency lower than a predetermined frequency.

Figure 12:
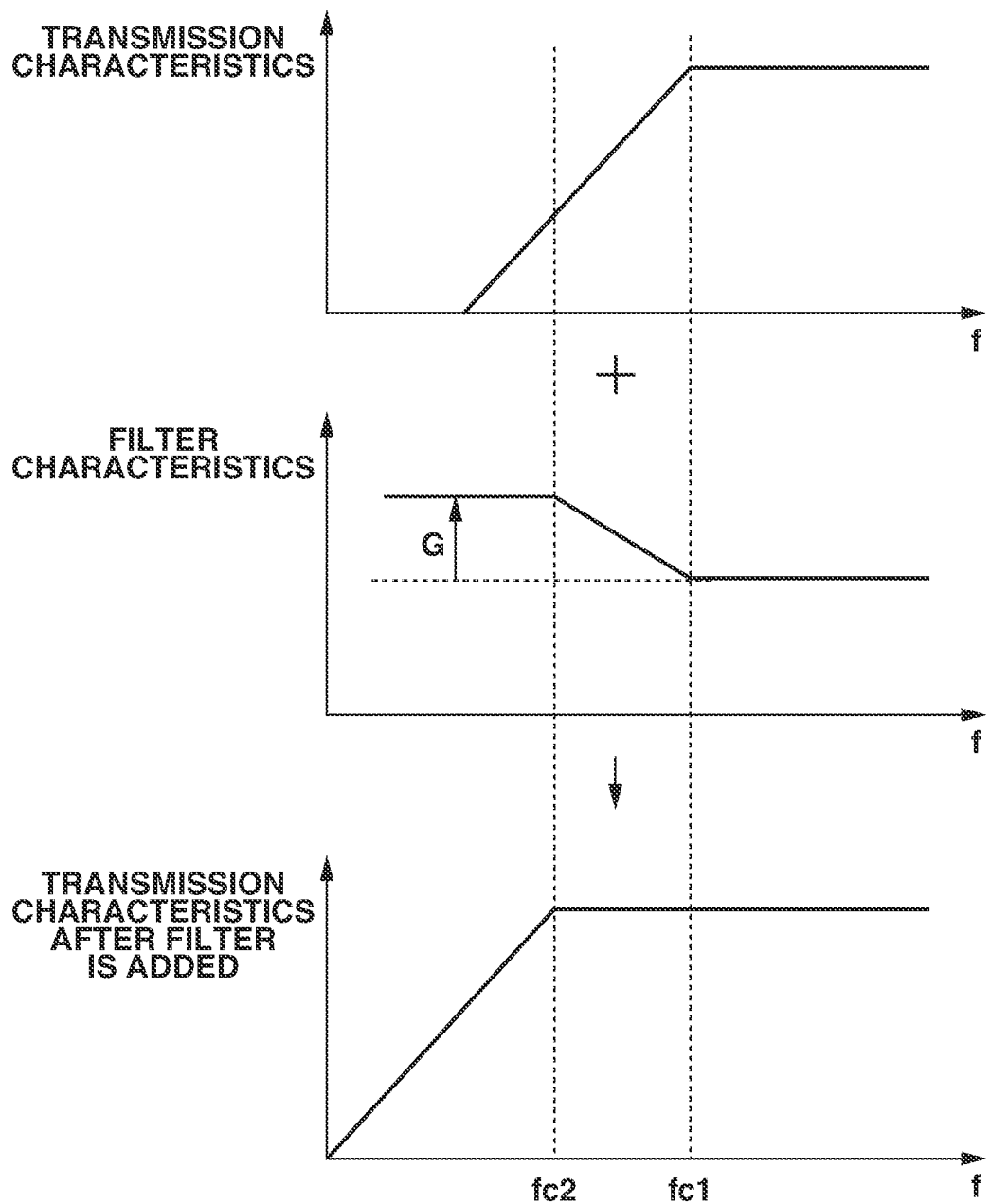
FIG. 12 illustrates characteristics and effects of a low frequency correction circuit according to one embodiment.

FIG. 12 illustrates transmission characteristics of the system 100 not including a low frequency correction circuit, filter characteristics of the low frequency correction circuit, and transmission characteristics of the system 100 that includes the low frequency correction circuit. FIG. 12 will be described by using a cutoff frequency fc1 on the low-frequency side of the transmission characteristics of the system 100 not including a low frequency correction circuit and a cutoff frequency fc2 on the low-frequency side of the transmission characteristics of the system 100 includes the low frequency correction circuit. As illustrated in the middle portion in FIG. 12, the low frequency correction circuit added to the system 100 has filter characteristics such that the gain in the lower frequency is G times larger than in the higher frequency, and the gain is attenuated at approximately 6 dB/oct in the frequency band between the cutoff frequencies fc1 and fc2. By adding this low frequency correction circuit to the system 100, the cutoff frequency on the low-frequency side of the transmission characteristics can be expanded from the cutoff frequency fc1 to the cutoff frequency fc2.

Figure 13:
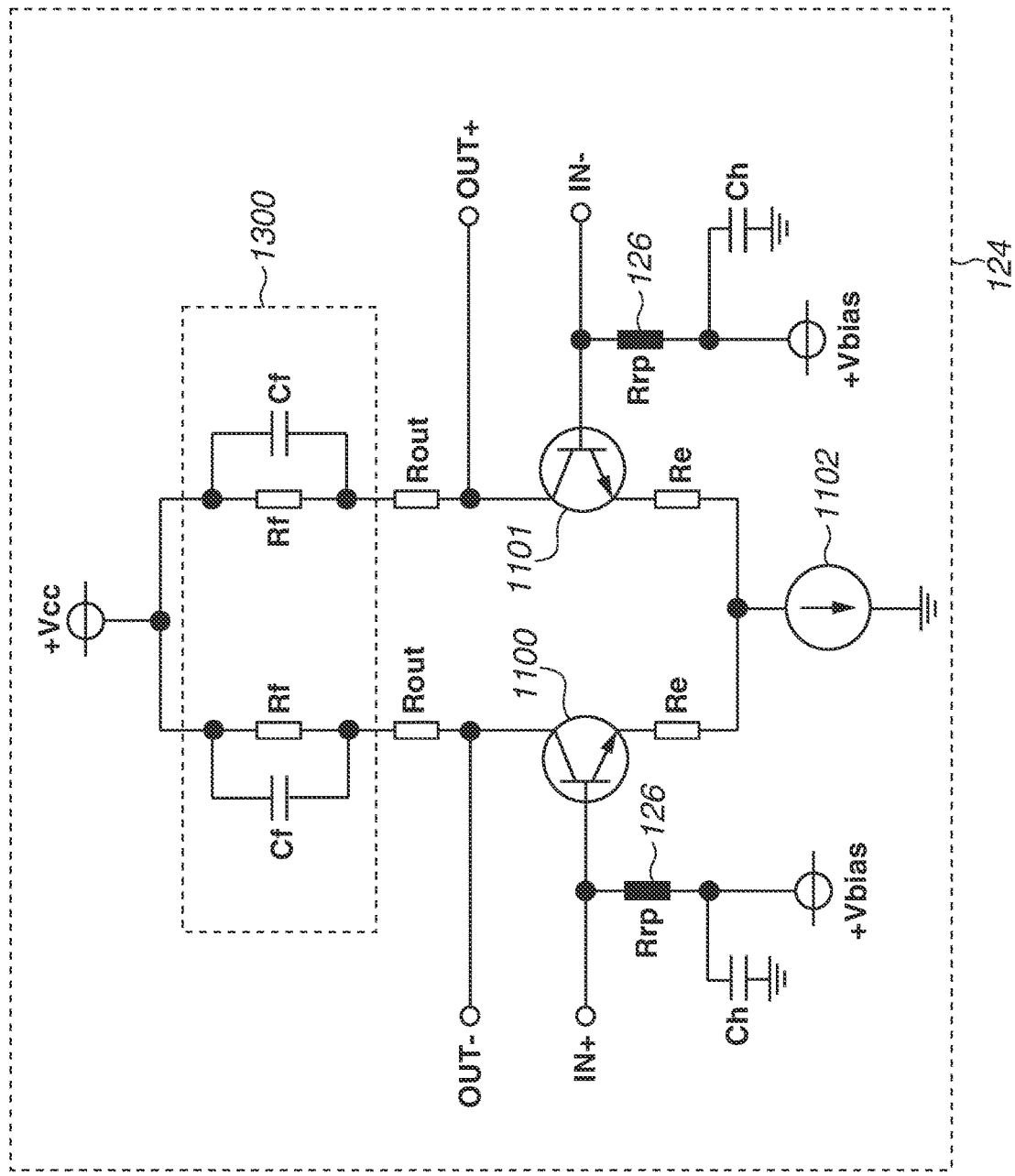
FIG. 13 illustrates a configuration example of a shaping circuit including a low frequency correction circuit according to one embodiment.

FIG. 13 illustrates a circuit configuration example in which the low frequency correction circuit is integrated into the shaping circuit 124 illustrated in FIG. 11. In FIG. 13, a portion 1300 surrounded by a dotted line corresponds to the low frequency correction circuit. The low frequency correction circuit is configured by connecting a resistance Rf and a capacitor Cf in parallel to each other. For example; the resistance Rf is set to a value such that a gain G satisfies G=(Rf+Rout)/Rout. The capacitor Cf is set to a value smaller than the resistance Rf and the resistance Rout in the high frequency band of a signal transmitted. An amplification factor GL in the low frequency in which the impedance of the capacitor Cf is sufficiently large is represented by GL=(Rf+Rout)/Re. An amplification factor GH in the high frequency in which the impedance of the capacitor Cf is sufficiently small is represented by GH=Rout/Re. The gain G is calculated by G=GL/GH. In the above mathematical expressions regarding the gain G and the amplification factor GL, resistance values are assumed to be large enough to ignore the input impedance of the reception circuit 122 connected to the output terminals +out and −out are used, for convenience of description.

By providing the low frequency correction circuit, the low frequency correction can be implemented easily and inexpensively. The circuit described above is merely an example, and the low frequency correction circuit may have a different configuration that can emphasize the low frequency of signals. For example, the low frequency correction circuit may be configured by a passive element filter such as a resistor and a capacitor as described above or may be configured by using an active element such as an operational amplifier. The low frequency correction circuit does not need to be integrated with the shaping circuit 124. For example, the low frequency correction circuit may be provided between the shaping circuit 124 and the reception circuit 122 or may be provided on the module 110 side, as long as the low frequency correction circuit exists on the transmission lines between the transmission circuit 112 and the reception circuit 122.

In addition, by performing processing for reducing the low frequency components of signals transmitted, e.g., by performing 8B10B encoding or scrambling on baseband signals transmitted, deterioration of the communication quality in the low frequency can be further reduced. In addition, the band may be limited by modulating the signals.

[Suppression of Multiple Reflection]

Figure 8:
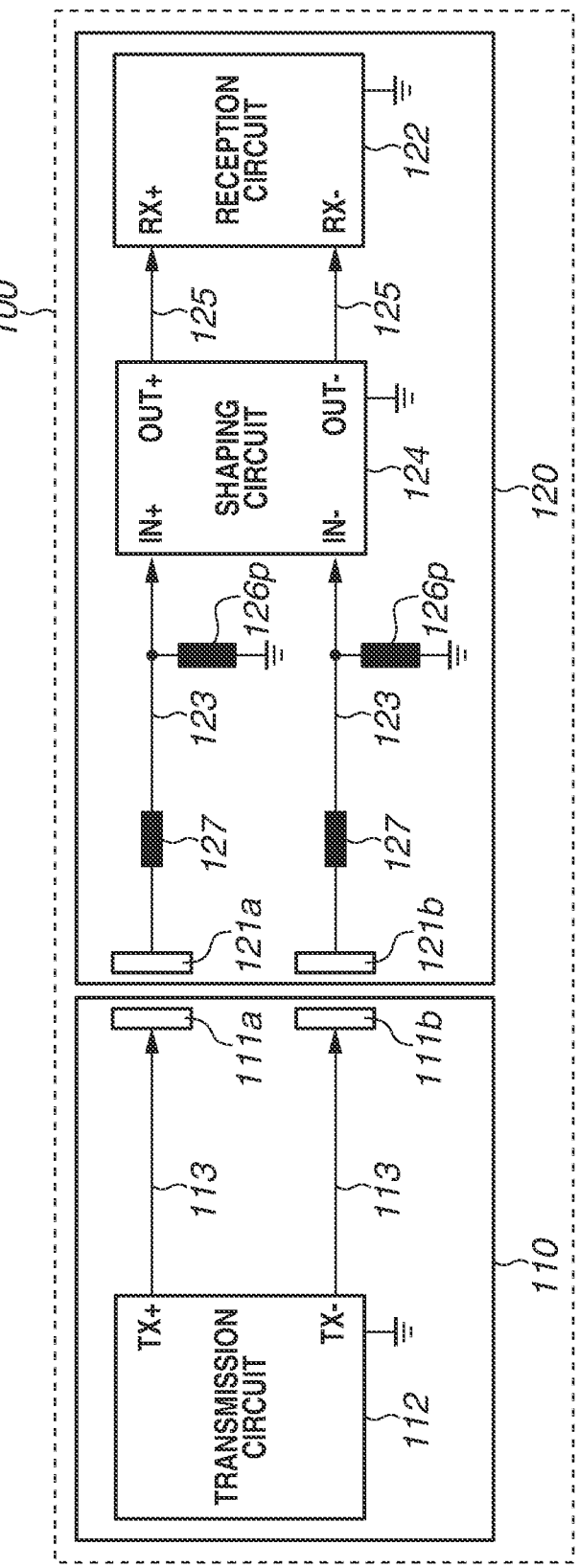
FIG. 8 illustrates a configuration of a wireless communication system including damping resistors according to one embodiment.

FIG. 8 illustrates a configuration example of a system 100 in which damping resistors 127 are added to the configuration in FIG. 1. The damping resistors 127 are disposed on the transmission lines 123 that connect the coupler 121 and the termination resistors 126. By adding the damping resistors 127 to the system 100, multiple reflection that occurs on the transmission lines 123 between the coupler 121 and the shaping circuit 124 can be suppressed, and consequently, noise can be reduced. A resistance value Rrs of the damping resistor 127 is set to a value smaller than the resistance value Rrp of the termination resistor 126. For example, when the resistance value Rrp is 10 kΩ, the resistance value Rrs is set to 10Ω to several hundred Ω. In addition, by adding ferrite beads to the transmission lines 123, the multiple reflection can be suppressed further, and consequently, noise is reduced. These configurations can further improve the communication quality.

[Variations of Coupler Structure]

Figure 9A:
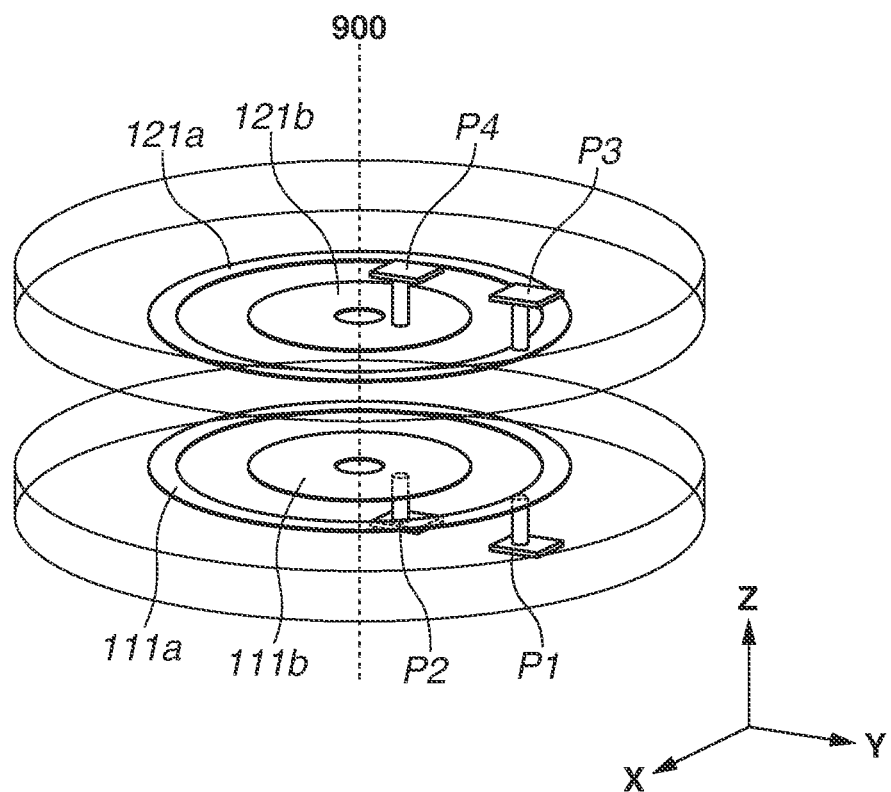
FIGS. 9A and 9B illustrate a configuration example of rotatable couplers according to one embodiment.
Figure 9B:
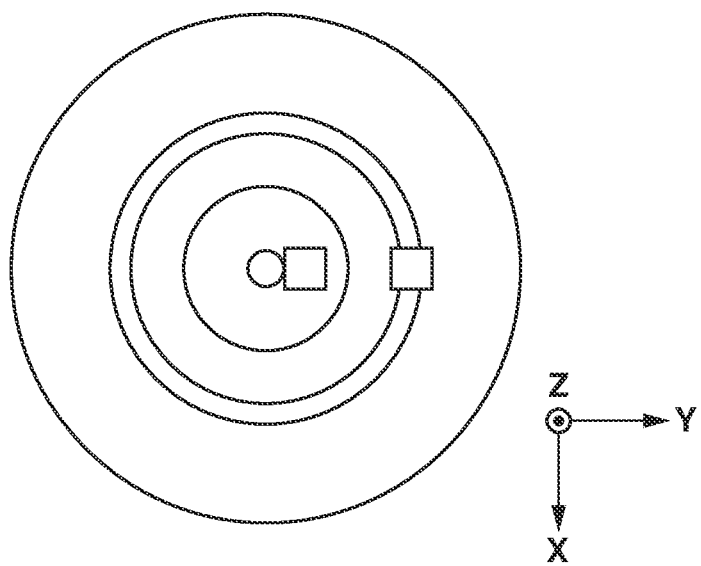

FIGS. 9A and 9B illustrate a variation of the structures of the couplers 111 and 121. FIG. 9A is a perspective view illustrating structures of the couplers 111 and 121. FIG. 9B is a plan view illustrating, as an example, the structures of the couplers 111 and 121 seen from the Z axis direction. In the example of the structures of the couplers 111 and 121 illustrated in FIGS. 2A and 2B, the relative position between the couplers 111 and 121 is fixed. In contrast, in the example illustrated in FIGS. 9A and 9B, the couplers 111 and 121 are relatively rotatable about a center axis 900. In this case, the system 100 includes a motor or the like for relatively rotating the couplers 111 and 121.

As illustrated in FIG. 9A, electrodes 111a and 111b are ring-shaped planar conductors, each of which has its center approximately at the center axis 900 and has a different diameter. Likewise, electrodes 121a and 121b are ring-shaped planar conductors, each of which has its center approximately at the center axis 900 and has a different diameter. Feeding points P1, P2, P3, and P4 are connected to the electrodes 111a, 111b, 121a, and 121b, respectively.

As illustrated in FIG. 9B, when seen from the Z axis direction, the electrodes 111a and 121a overlap with each other, and the electrodes 111b and 121b overlap with each other. The center axis 900 runs in the Z axis direction that approximately passes through the center of the electrodes 111a, 111b, 121a, and 121b. The center axis 900 is a conceptional rotation axis. The system 100 may or may not have a physical shaft as the center axis 900. The coupler 111 and/or the coupler 121 is rotatable about the center axis 900 while maintaining the positional relationship in which the couplers 111 and 121 are adjacently disposed to face each other. With such structures, even when the modules 110 and 120 relatively rotate, the change in the degree of the electromagnetic field coupling between the couplers 111 and 121 can be reduced. Thus, wireless communication can stably be performed. For example, the system 100 is applicable to wireless communication between an imaging unit and a platform of a network camera and wireless communication for joints of a robot arm.

The electrodes 111a, 111b, 121a, and 121b are not limited to ring-shaped conductors. The electrodes may have any shape that can reduce the change in the degree of coupling even when the couplers 111 and 121 are relatively rotated. For example, the electrodes may have a polygonal shape or have a slit (a shape in which the ring is partially broken). In addition, each of the electrodes 111a and 121a may have a different diameter, or each of the electrodes 111b and 121b may have a different diameter.

Figure 10A:
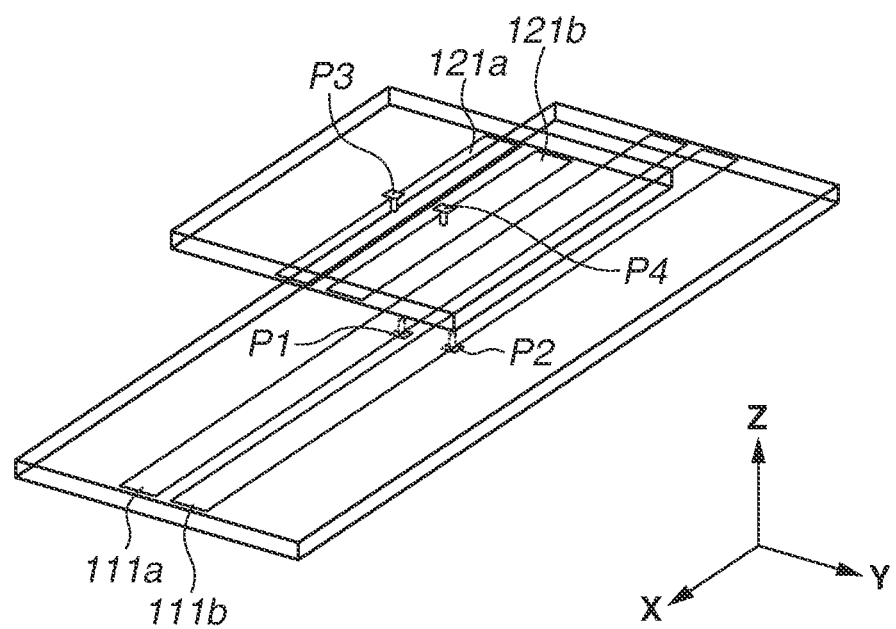
FIGS. 10A and 10B illustrate a configuration examples of slidable couplers according to one embodiment.
Figure 10B:
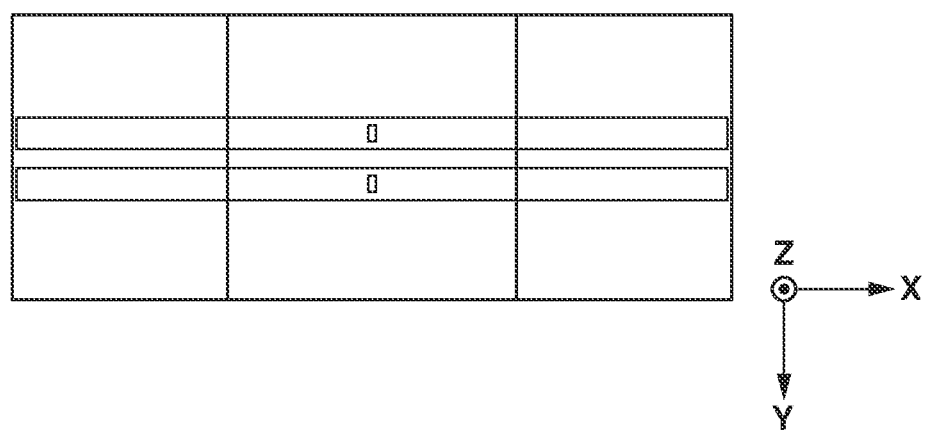

FIGS. 10A and 10B illustrate another variation of the structures of the couplers 111 and 121. FIG. 10A is a perspective view illustrating structures of the couplers 111 and 121. FIG. 10B is a plan view illustrating, as an example, the structures of the couplers 111 and 121 seen from the Z axis direction. In the example illustrated in FIGS. 10A and 10B, the couplers 111 and 121 are relatively linearly movable in the X axis direction. In this case, the system 100 includes a motor, rails, etc. for relatively moving the couplers 111 and 121.

The feeding points P1, P2, P3, and P4 are connected to the center portions of the electrodes 111a, 111b, 121a, and 121b, respectively. Each of the electrodes 111a, 111b, 121a, and 121b is a plate conductor that is elongated in the X axis direction. The length of the electrodes 111a and 111b in the longitudinal direction (X axis direction) is longer than that of the electrodes 121a and 121b in the longitudinal direction. When seen from the Z axis direction, a part of the electrode 111a overlaps with the electrode 121a, and a part of the electrode 111b overlaps with the electrode 121b.

The coupler 111 and/or the coupler 121 can linearly move in the X axis direction while maintaining the positional relationship in which the couplers 111 and 121 are adjacently disposed to face each other. With such structures, even when the module 110 and the module 120 relatively slide, the change in the degree of the electromagnetic field coupling between the couplers 111 and 121 can be reduced. Thus, wireless communication can stably be performed. For example, the system 100 is applicable to wireless communication between a main unit and a printer head of an inkjet printer, wireless communication between a rotary part and a turning part of a CT apparatus, wireless communication between a stage and a main unit of an exposure apparatus, wireless communication between a drive part and a fixed part of a multi-axis actuator.

As the coupler structure that allows the couplers 111 and 121 to linearly move in the X axis direction, the structure in which the feeding points are arranged at the respective center portions of the electrodes 111a, 111b, 121a, and 121b has been described with reference to FIGS. 10A and 10B. However, the coupler structure is not limited to this example. For example, the electrodes 111a and 111b, which are plate conductors elongated in the X axis direction, may be disposed to operate as transmission lines that have a characteristic impedance Z and that extend in the X axis direction. A transmission-line-type coupler structure may be configured by disposing a feeding point at an end portion of each of the electrodes 111a and 111b and by disposing a termination resistor approximately equivalent to the characteristic impedance Z of these transmission lines at the other end portion. With this transmission-line-type coupler structure, standing waves that occur in the electrodes 111a and 111b can be reduced. Thus, the length of the electrodes 111a and 111b in the X axis direction can be set to an arbitrary value. The electrodes 121a and 121b may have the transmission-line-type coupler structure. Alternatively, both of the pair of electrodes 111a and 111b and the pair of electrodes 121a and 121b may have the transmission-line-type coupler structure.

As described above, the system 100 according to the present exemplary embodiment performs wireless communication in the baseband manner between the modules 110 and 120. The coupler 111 included in the module 110 is coupled to the coupler 121 included in the module 120 by the electromagnetic field. The module 120 includes the termination resistors 126 that reduce a drop in a low-frequency component of a signal transmitted from the coupler 111 to the coupler 121 by electromagnetic field coupling. The module 120 receives a signal output from the coupler 121 in response to input of a transmitted signal to the coupler 111 or a signal obtained by performing amplification processing on the output signal, and processes the signal as a received signal that is obtained by reproducing the transmitted signal. Alternatively, the module 120 receives a signal output from the coupler 121 or a signal obtained by shaping, via the comparator, a signal obtained by performing amplification processing on the output signal, and processes the signal as a received signal that is obtained by reproducing the transmitted signal. With the configuration described above, communication errors in wireless communication based on the electromagnetic field coupling between couplers can be reduced.

<Variations>

[System Configuration]

In the above exemplary embodiment, by setting the resistance value Rrp of the termination resistors 126 to an impedance higher than a predetermined value, it is possible to reduce a drop in the low-frequency component in the transmission characteristics of the system (the transmission characteristics from the output terminal of the transmission circuit 112 to the input terminal or the output terminal of the shaping circuit 124). That is, the description of the above exemplary embodiment has been made on the wireless communication system that can transmit an output signal of the coupler 121 while maintaining its approximately rectangular waveform. Ideally, flat transmission characteristics expand to lower frequency the higher impedance the resistance value Rrp is set to. However, in practice, the high-frequency characteristics could be deteriorated since this setting increases the impact of the parasitic components inherent in the resistors. In addition, the wireless communication system could be affected more easily by external noise.

In view of this, in the present variation, a wireless communication system that enables flat frequency band characteristics even in a lower frequency will be described. In this variation, the resistance value Rrp is fixed, and low frequency correction circuits that amplify low-frequency signals are added in the transmission side (module 110).

Figure 14:
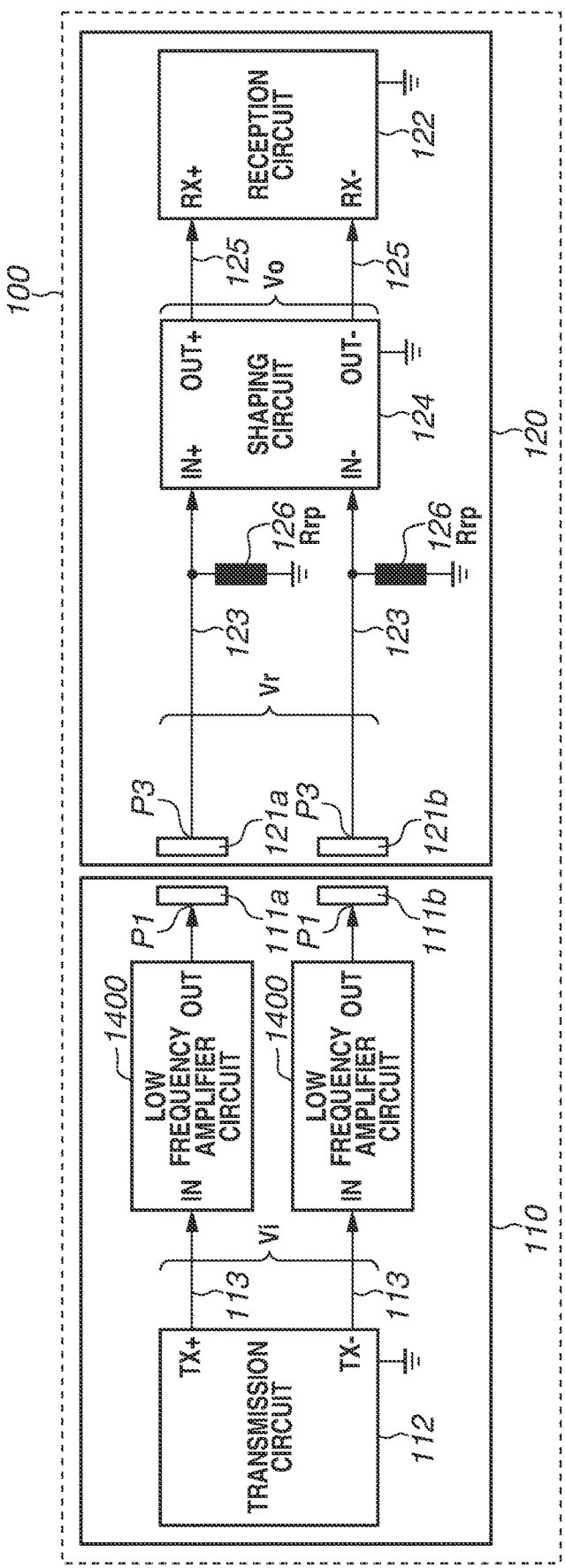
FIG. 14 illustrates a system configuration of a wireless communication system according to one embodiment.

FIG. 14 illustrates a configuration example of a system 100 that includes, in addition to the elements in the wireless communication system described with FIG. 1, low frequency amplifier circuits 1400 between the transmission circuit 112 and the coupler 111. Each of the low frequency amplifier circuits 1400 includes a low frequency correction circuit. In this system, the low frequency amplifier circuits 1400 (namely, the low frequency correction circuits) have the filter characteristics as illustrated by the middle portion of FIG. 12. In a case where the transmission characteristics of a system that does not include the low frequency amplifier circuits 1400 are represented by the upper portion of FIG. 12 (cutoff frequency=fc1), by setting the filter characteristics of the low frequency amplifier circuits 1400 as those illustrated in the middle portion of FIG. 12, the transmission characteristics of a system including the low frequency amplifier circuits 1400 can be expanded as those illustrated in the lower portion of FIG. 12. More specifically, the cutoff frequency can be expanded from fc1 to fc2. In other words, in a case where the bandwidth of the system including the low frequency amplifier circuits 1400 is set to approximately the same as that of the system including no low frequency amplifier circuits 1400, the resistance value Rrp can be set to a lower value. In this way, it is possible to implement a wireless communication system that is less easily affected by external noise.

[Circuit Configuration]

Figure 15:
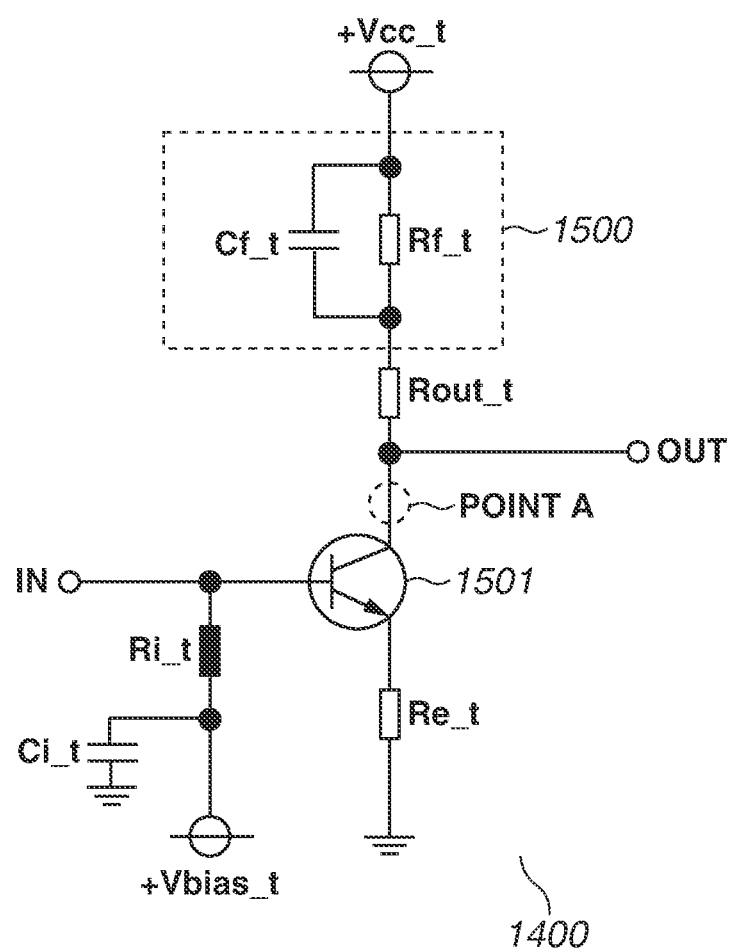
FIG. 15 illustrates a configuration example of a low frequency amplifier circuit according to one embodiment.

FIG. 15 illustrates a specific configuration example of a low frequency amplifier circuit 1400. FIG. 15 illustrates a single-ended grounded-emitter amplifier circuit including a transistor 1501. A transmitted signal from the transmission circuit 112 is input to an input terminal IN, and a signal on which low-frequency amplification has been performed is output to the coupler 111 from an output terminal OUT.

A resistor Ri_t and a capacitor Ci_t are inserted between the input terminal IN and a base terminal of the transistor 1501. The capacitor Ci_t is a bypass capacitor inserted such that the input impedance of the low frequency amplifier circuit 1400 is recognized as Ri_t in the signal band, regardless of the output impedance of a power supply that outputs a bias voltage +Vbias_t applied to the base terminal of the transistor 1501. Therefore, the capacitor Ci_t is set to an impedance sufficiently small (for example, 1 µF) in the band of a signal transmitted. The resistor Ri_t is set to 50Ω, for example. In addition, the bias voltage +Vbias_t is set to a voltage value such that the transistor 1501 mainly operates in the active region.

A resistor Rout_t is for determining an output impedance of the low frequency amplifier circuit 1400 in a high-frequency range and is set to 50Ω, for example. The output terminal OUT is led out from a portion between a collector terminal of the transistor 1501 and the resistor Rout_t. Alternatively, the resistor Rout_t may be shorted (Rout_t=0) or may be formed at a point A (the output terminal OUT may be led out from a portion between the resistors Rout_t and Rf_t).

A resistor Re_t is for controlling the amplification degree of the low frequency amplifier circuit 1400 and is set to an appropriate value in accordance with the strength of a signal transmitted. Alternatively, the resistor Re_t may be shorted (Re_t=0). Alternatively, a known circuit configuration may be adopted by inserting a capacitor in parallel to the resistor Re_t to increase the gain in a high frequency.

In FIG. 15, the circuit surrounded by a dotted line 1500 corresponds to the low frequency correction circuit. The low frequency correction circuit illustrated in FIG. 15 is configured by connecting the resistor Rf_t and a capacitor Cf_t in parallel to each other. These settings are the same as those of the resistor Rf and the capacitor Cf described with reference to FIG. 13.

[Simulation Results]

(System Assuming Resistance Value Rrp>50Ω)

The transmission characteristics of a system configuration including the low frequency amplifier circuits 1400 described with reference to FIG. 14 will be compared with the transmission characteristics of a system configuration not including the low frequency amplifier circuits 1400 based on simulation results with reference to FIGS. 16A to 16C. FIG. 16A illustrates a simulation program with integrated circuit emphasis (SPICE) model used in the simulation analysis. A circuit surrounded by a dotted line 1600 is a low frequency amplifier circuit. This low frequency amplifier circuit has a topology similar to that of the emitter amplifier circuit described with reference to FIG. 15.

FIG. 16B is a table illustrating constant values of various components in the circuit. Under a column "value 1", there are listed constant values when a low frequency correction circuit 1601 in the low frequency amplifier circuit is enabled. Under a column "value 2", there are listed constant values when the low frequency correction circuit 1601 is disabled. In the present simulation analysis, the low frequency correction circuit 1601 was disabled by using the constant value of a capacitor Cf_t. Specifically, the low frequency correction was disabled by setting a constant value Cf_t=1 µF, which is a value that makes the impedance sufficiently smaller in the signal band, compared with a resistor Rf_t. Since the resistor Rf_t is not changed in this disabling method, it is possible to compare the presence and absence (enabled state and disabled state) of the low frequency correction circuit while maintaining a direct-current-like bias voltage applied between terminals of the transistor. This analysis was made by setting a coupler CC to ideal 0.5 pF and setting a termination resistance value Rrp to a pure resistance of 10 kΩ.

FIG. 16C illustrates simulation results of the transmission characteristics analyzed. The horizontal axis represents the frequency, and the vertical axis represents the ratio of an input signal Vi and an output signal Vr applied to the termination resistor Rrp (Vr/Vi (gain)). The solid line represents the transmission characteristics when the low frequency correction circuit 1601 is enabled (when the constant values under value 1 are set), and the dotted line represents the transmission characteristics when the low frequency correction circuit 1601 is disabled (when the constant values under value 2 are set). The cutoff frequency in the case where the low frequency correction circuit 1601 is disabled is 31 MHz while the cutoff frequency in the case where the low frequency correction circuit 1601 is enabled is 10 MHz or less. Accordingly, it can be seen that the flat bandwidth is expanded to the low frequency side by enabling the low frequency amplifier circuit.

As described above, the flat transmission characteristics can be expanded to the lower frequency side by adding the low frequency correction circuit to the transmission side. For convenience of description, the analysis was made assuming that the present SPICE model was used with single-ended signals, instead of differential signals. However, the same effects can be obtained even in a case where the SPICE model is used with differential signals.

(System Using Configuration Having Low Frequency Correction Circuit in Shaping Circuit in Combination)

In the system described in the present variation, the module 120 on the reception side may have the above-described configuration. For example, if a circuit configuration in which the low frequency correction circuits are integrated with the above shaping circuit 124 is used in combination with the present variation, the flat bandwidth can be expanded to the lower frequency side.

The transmission characteristics based on a case where the low frequency correction circuits are provided in the shaping circuit 124 will be compared with the transmission characteristics based on a case where the low frequency correction circuits are not provided based on simulation results with reference to FIGS. 17A to 17C. FIG. 17A illustrates a SPICE model used in the simulation analysis. A circuit surrounded by a dotted line 1700 is a configuration example of an amplifier circuit including low frequency correction circuits provided in the shaping circuit 124. In the present simulation analysis, a single-ended emitter amplifier circuits were used.

FIG. 17B is a table illustrating constant values of various components within the dotted line 1700. Under value 3, there are listed constant values when the low frequency correction circuit 1701 in an amplifier circuit is enabled. Under value 4, there are listed constant values when the low frequency correction circuit 1701 is disabled. In the present simulation analysis, too, the low frequency correction circuit 1701 was disabled by using the constant value of a capacitor Cf_r. Specifically, the low frequency correction was disabled by setting a capacitor Cf_r=1 µF.

A circuit surrounded by the dotted line 1600 is the same circuit as the low frequency amplifier circuit described with reference to FIG. 16A. The constant values under value 1 in FIG. 16B are set (the low frequency correction circuit is enabled). This analysis was made by setting a coupler CC to ideal 0.5 pF.

FIG. 17C illustrates simulation results of the transmission characteristics analyzed. The horizontal axis represents the frequency, and the vertical axis represents the ratio of an input signal Vi and a received signal Vo (Vo/Vi (gain)). The solid line represents the transmission characteristics when the low frequency correction circuit 1701 is enabled (when the constant values under value 3 are set), and the dotted line represents the transmission characteristics when the low frequency correction circuit 1701 is disabled (when the constant values under value 4 are set). In addition to the low frequency correction circuit 1701, the transmission characteristics when the low frequency correction circuit 1601 on the transmission side is disabled are represented by the dashed gray line, for reference. The cutoff frequency in the case where the low frequency correction circuit 1701 is disabled is 65 MHz while the cutoff frequency in the case where the low frequency correction circuit 1701 is enabled is 15 MHz. It can be seen that the flat bandwidth is expanded to the lower frequency side by providing the low frequency correction circuit in the shaping circuit 124.

As described above, by adding the low frequency correction circuits on both the transmission side and reception side, the flat transmission characteristics are further expanded to the lower frequency. For convenience of description, the analysis was made assuming that the SPICE model was used with single-ended signals, instead of differential signals. However, the same effects can be obtained even in a case where the SPICE model is used with differential signals. In addition, while the shaping circuit 124 includes only the emitter amplifier circuit, the configuration of the shaping circuit 124 is not limited thereto. For example, a circuit such as a different amplifier circuit, a limiting amplifier, or a comparator may be provided in a downstream stage, and a signal transmitted via this circuit may be treated as the received signal Vo.

(System Assuming Rrp=50Ω)

In the present variation, the resistance value Rrp does not necessarily need to be set to a resistance value higher than 50Ω. The resistance value Rrp may be set to 50Ω or less. A low frequency amplifier circuit that realizes a flat bandwidth even when the resistance value Rrp is set to 50Ω will be described based on a simulation result with reference to FIGS. 18A to 18C.

FIG. 18A is a SPICE model used in the simulation analysis. This model is the same as that illustrated in FIG. 16A. FIG. 18B is a table illustrating constant values of various components set by the SPICE model. FIG. 18C illustrates a simulation result of the transmission characteristics. The horizontal axis represents the frequency, and the vertical axis represents the ratio of an input signal Vi and an output signal Vr (Vr/Vi (gain)).

It can be seen from FIG. 18C that, even in a case where the resistance value Rrp is set to 50Ω, flat bandwidth is realized in the band of a frequency of 50 MHz or higher. That is, by setting the resistance value Rf_t of the low frequency correction circuit and the voltage Vcc_t to high values, an amplification factor of the low frequency correction circuit on the low frequency side is increased. Thus, flat characteristics can be obtained in a wide range even in a case where the resistance value Rrp is fixed at 50Ω.

In the present variation, the transmitted signal output from the transmission circuit 112 is a baseband signal. However, the transmitted signal may be a modulated signal obtained by modulating the amplitude, frequency, phase, etc. of a carrier wave based on transmitted data. In a case where the modulated signal is used, the resistance value Rrp and the low frequency correction circuits may be set such that the transmission characteristics of the system become approximately flat in the frequency band of the modulation signal.

In addition, in the present variation, as an example, a single-ended grounded-emitter type amplifier circuit is used as the low frequency amplifier circuit. However, the low frequency amplifier circuit is not limited this example. For example, a differential grounded-emitter type amplifier circuit as that in FIG. 13 may be used.

While exemplary embodiments have been described, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-158663, filed Aug. 30, 2019 and Japanese Patent Application No. 2020-107127, filed Jun. 22, 2020 which are hereby incorporated by reference herein in their entirety.

What is claimed is:

1. A communication apparatus that performs wireless communication, the communication apparatus comprising:
   a second coupler configured to be coupled to a first coupler of a different communication apparatus by at least one of electric field coupling or inductive coupling;
   a termination resistor connected to the second coupler and having a resistance value larger than a predetermined value;
   a reception unit configured to receive a signal comprising (i) an output signal that is output from the second coupler in response to input of a transmitted signal to the first coupler, (ii) a signal obtained by performing amplification processing on the output signal that is output from the second coupler in response to input of a transmitted signal to the first coupler, or (iii) a signal obtained by shaping, via a comparator, a signal obtained by performing amplification processing on the output signal that is output from the second coupler in response to input of a transmitted signal to the first coupler; and
   a processing unit configured to process the signal received by the reception unit as a signal that is obtained by reproducing the transmitted signal that is input to the first coupler,
   wherein $R>1/(2\pi f1 \times C)$ is satisfied, where a resistance value of the termination resistor is represented by R, coupling capacitance between the first coupler and the second coupler is represented by C, and a fundamental frequency of the transmitted signal is represented by f1.

2. The communication apparatus according to claim 1, wherein $R>1/(2\pi f2 \times C)$ is satisfied, where a low frequency of the transmitted signal in accordance with a restriction on the number of consecutive bits of a same code in the transmitted signal is represented by f2.

3. The communication apparatus according to claim 1, further comprising a damping resistor located on a transmission line that connects the second coupler and the termination resistor.

4. The communication apparatus according to claim 3, wherein a resistance value of the damping resistor is smaller than the resistance value of the termination resistor.

5. The communication apparatus according to claim 1, comprising a ferrite bead located on a transmission line that connects the second coupler and the termination resistor.

6. The communication apparatus according to claim 1, wherein the communication apparatus includes a circuit that performs amplification processing on a signal that is output from the second coupler and the reception unit receives a signal on which amplification processing has been performed by the circuit.

7. The communication apparatus according to claim 6, wherein the circuit is a low frequency correction circuit that amplifies a signal having a frequency lower than a predetermined frequency.

8. The communication apparatus according to claim 6, wherein the circuit is a differential amplifier circuit.

9. The communication apparatus according to claim 1,
wherein the transmitted signal that is input to the first coupler has a rectangular waveform, and
wherein a signal that is output from the second coupler has an approximately rectangular waveform.

10. The communication apparatus according to claim 1, wherein the transmitted signal input to the first coupler and the received signal received by the reception unit are differential signals.

11. The communication apparatus according to claim 1, wherein the transmitted signal input to the first coupler and the received signal received by the reception unit are single-ended signals.

12. The communication apparatus according to claim 1, wherein at least one of the first coupler or the second coupler is constituted by a transmission line including a feeding part to which the transmitted signal is input and a termination part in which a termination resistor approximately equal to a characteristic impedance is arranged.

13. A wireless communication system in which communication is performed between a first communication apparatus and a second communication apparatus,
wherein the first communication apparatus comprises:
a second coupler configured to be coupled to a first coupler of the second communication apparatus by at least one of electric field coupling or inductive coupling;
a termination resistor connected to the second coupler and having a resistance value larger than a predetermined value;
a reception unit configured to receive a signal comprising: (i) an output signal that is output from the second coupler in response to input of a transmitted signal to the first coupler, (ii) a signal obtained by performing amplification processing on the output signal that is output from the second coupler in response to input of a transmitted signal to the first coupler, or (iii) a signal obtained by shaping, via a comparator, a signal obtained by performing amplification processing on the output signal that is output from the second coupler in response to input of a transmitted signal to the first coupler; and
a processing unit configured to process the signal received by the reception unit as a signal that is obtained by reproducing the transmitted signal that is input to the first coupler, and
wherein the second communication apparatus comprises a transmission unit configured to input the transmitted signal to the first coupler, and
wherein $R>1/(2\pi f1 \times C)$ is satisfied, where a resistance value of the termination resistor is represented by R, coupling capacitance between the first coupler and the second coupler is represented by C, and a fundamental frequency of the transmitted signal is represented by f1.

14. The wireless communication system according to claim 13,
wherein the transmission unit inputs, to the first coupler, a signal outputted by a low frequency correction circuit that amplifies a signal having a frequency lower than a predetermined frequency, as the transmitted signal.

15. The wireless communication system according to claim 13,
wherein the first communication apparatus is included in a first portion of a machine that is driven by a motor,
wherein the second communication apparatus is included in a second portion of the machine, and
wherein the processing unit controls an operation of the first portion of the machine in accordance with the received signal received by the reception unit.

16. The wireless communication system according to claim 13,
wherein the first communication apparatus is included in a first portion of an imaging apparatus,
wherein the second communication apparatus is included in a second portion of the imaging apparatus, and
wherein the transmission unit inputs, to the first coupler, a signal representing image data acquired by the second portion of the imaging apparatus, as the transmitted signal.

17. A communication method for performing wireless communication by using a first communication apparatus including a first coupler and a second communication apparatus including a second coupler, wherein the second coupler is coupled to the first coupler by at least one of electric field coupling or inductive coupling, and a termination resistor of the second communication apparatus is connected to the second coupler, the communication method, comprising:
inputting a transmitted signal to the first coupler;
receiving a signal comprising (i) an output signal that is output from the second coupler in response to input of the transmitted signal to the first coupler, (ii) a signal obtained by performing amplification processing on the output signal that is output from the second coupler in response to input of the transmitted signal to the first coupler, or (iii) a signal obtained by shaping, via a comparator, a signal obtained by performing amplification processing on the output signal that is output from the second coupler in response to input of the transmitted signal to the first coupler; and
processing the received signal as a signal that is obtained by reproducing the transmitted signal input to the first coupler,
wherein $R>1/(2\pi f1 \times C)$ is satisfied, where a resistance value of the termination resistor is represented by R, coupling capacitance between the first coupler and the second coupler is represented by C, and a fundamental frequency of the transmitted signal is represented by f1.

18. The communication method according to claim 17, wherein a signal that is output from a low frequency correction circuit that amplifies a signal having a frequency lower than a predetermined frequency is input to the first coupler as the transmitted signal.

* * * * *